US012812966B2

(12) United States Patent
Yu et al.

(10) Patent No.: US 12,812,966 B2

(45) **Date of Patent: *Nov. 24, 2026**

(54) MEMORY DEVICE, SEMICONDUCTOR DIE, AND METHOD OF FABRICATING THE SAME

(71) Applicant: Taiwan Semiconductor Manufacturing Company, Ltd., Hsinchu (TW)

(72) Inventors: Chia-Jung Yu, Hsinchu (TW); Pin-Cheng Hsu, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 208 days.

This patent is subject to a terminal disclaimer.

(21) Appl. No.: 18/643,981

(22) Filed: Apr. 23, 2024

(65) Prior Publication Data

US 2024/0282770 A1 Aug. 22, 2024

Related U.S. Application Data

(63) Continuation of application No. 17/458,593, filed on Aug. 27, 2021, now Pat. No. 11,996,405.

(51) Int. Cl.

*H10D 84/83* (2025.01)
*H10B 61/00* (2023.01)

(Continued)

(52) U.S. Cl.

CPC ............. *H10D 84/83* (2025.01); *H10B 61/22* (2023.02); *H10D 84/0126* (2025.01); *H10D 84/038* (2025.01)

(58) Field of Classification Search

CPC ........ H10B 61/20; H10B 61/22; H10B 10/12; H10B 10/125; H10B 63/10; H10B 63/30; H10B 63/84; H10B 12/03; H10B 12/033; H10B 12/0335; H10B 12/05; H10B 99/22; H10D 84/0123; H10D 84/0133; H10D 84/0126; H10D 84/013; H10D 84/0135; H10D 84/0128; H10D 84/0149; H10D 84/0151; H10D 84/038; H10D 84/83; H10D 64/311; H10D 64/511; H10D 64/529; H10D 64/505; H10D 64/62; H10D 62/10; H10D 62/351; H10D 62/357; H10D 62/364; H10D 62/378; H10D 88/00; H10D 84/8311; H10D 84/8312; H10D 84/83125; H10D 84/83135; H10D 84/83138; H10D 84/8314; H10D 84/8316; H10D 84/832; H10D 84/833; H10D 84/835; H10D 84/836;

(Continued)

(56) References Cited

U.S. PATENT DOCUMENTS

| | | | | |
|---|---|---|---|---|
| 11,996,405 | B2 * | 5/2024 | Yu | H10D 84/038 |
| 2011/0014754 | A1 * | 1/2011 | Park | H10B 10/125 257/E21.616 |

(Continued)

*Primary Examiner* — Natalia A Gondarenko

(74) *Attorney, Agent, or Firm* — JCIPRNET

(57) ABSTRACT

A memory device including bit lines, auxiliary lines, selectors, and memory cells is provided. The word lines are intersected with the bit lines. The auxiliary lines are disposed between the word lines and the of bit lines. The selectors are inserted between the bit lines and the auxiliary lines. The memory cells are inserted between the word lines and the auxiliary lines.

20 Claims, 24 Drawing Sheets

SD4

(51) Int. Cl.
*H10D 84/01* (2026.01)
*H10D 84/03* (2025.01)

(58) Field of Classification Search
CPC .... H10D 84/837; H10D 84/839; H10N 50/01; H01L 27/088; H01L 27/0688; H01L 21/768; H01L 21/76805; H01L 21/76879; H01L 21/76897; H01L 21/8221; H01L 21/82385; H01L 21/823425; H01L 21/823475; H01L 21/8234; H01L 21/823871; H10W 20/01; H10W 20/057
USPC ...... 257/368, 209, 4, 295, 208, 379, 21.616; 438/128, 152, 254, 256
See application file for complete search history.

(56) References Cited

U.S. PATENT DOCUMENTS

| | | | | |
|---|---|---|---|---|
| 2019/0074277 | A1* | 3/2019 | Ramaswamy | H10D 88/00 |
| 2019/0206861 | A1* | 7/2019 | Beigel | H10D 30/6728 |
| 2020/0411426 | A1* | 12/2020 | Lajoie | H01L 23/53295 |
| 2022/0199624 | A1* | 6/2022 | Huang | H10B 12/30 |

* cited by examiner

MEMORY DEVICE, SEMICONDUCTOR DIE, AND METHOD OF FABRICATING THE SAME

CROSS-REFERENCE TO RELATED APPLICATION

This is a continuation application of and claims the priority benefit of U.S. application Ser. No. 17/458,593, filed on Aug. 27, 2021, now allowed. The entirety of the above-mentioned patent application is hereby incorporated by reference herein and made a part of this specification.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for miniaturization, higher speed and greater bandwidth, as well as lower power consumption and latency has grown recently, there has grown a need for semiconductor chips having embedded memory cells.

Some integrated circuit manufacturing processes include manufacturing steps associated with making data storage circuit elements. Data storage elements such as Dynamic Random Access Memory (DRAM), Static Random Access Memory (SRAM), flash memory (a form of non-volatile memory), place data storage circuit elements in an integrated circuit in tightly-packed arrays of elements, to minimize the amount of die area occupied by data storage elements. Magnetoresistive Random Access Memory (MRAM) is a type of data storage element in which information is stored based on the orientation of a magnetic field in a circuit element. MRAM uses the magnetic field to store information rather than the presence/absence of electrical charge in a storage circuit element, or with the quantity of electronic charge stored in a data storage circuit element.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
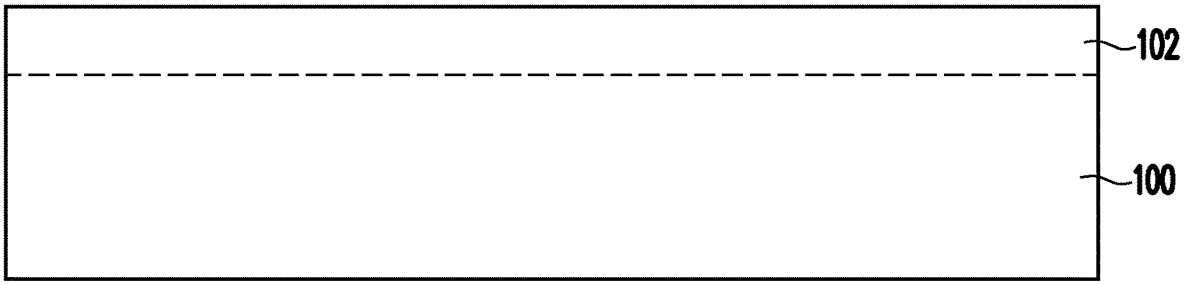
FIG. 1 through FIG. 20 are cross-sectional views schematically illustrating a process flow for fabricating a semiconductor device in accordance with some embodiments of the present disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 through FIG. 20 are cross-sectional views schematically illustrating a process flow for fabricating a semiconductor device in accordance with some embodiments of the present disclosure.

Referring to FIG. 1, a semiconductor substrate 100 is provided. In some embodiments, the semiconductor substrate 100 is a bulk semiconductor substrate, such as a semiconductor wafer. For example, the semiconductor substrate 100 includes silicon or other elementary semiconductor materials such as germanium. The semiconductor substrate 100 may be an un-doped or doped (e.g., p-type, n-type, or a combination thereof) semiconductor substrate. In some embodiments, the semiconductor substrate 100 includes an epitaxially grown semiconductor layer on a dielectric layer. The epitaxially grown semiconductor layer may be made of silicon germanium, silicon, germanium, one or more other suitable materials, or a combination thereof.

In some other embodiments, the semiconductor substrate 100 includes a compound semiconductor. For example, the compound semiconductor includes one or more III-V compound semiconductors having a composition defined by the formula $Al_{X1}Ga_{X2}In_{X3}As_{Y1}P_{Y2}N_{Y3}SbY4$, where X1, X2, X3, Y1, Y2, Y3, and Y4 represent relative proportions. Each one of X1, X2, X3, Y1, Y2, Y3, and Y4 is greater than or equal to zero, and added together they equal 1. The compound semiconductor may include silicon carbide, gallium arsenide, indium arsenide, indium phosphide, one or more other suitable compound semiconductors, or a combination thereof. Other suitable substrate including II-VI compound semiconductors may also be used.

In some embodiments, the semiconductor substrate 100 is an active layer of a semiconductor-on-insulator (SOI) substrate. The SOI substrate may be fabricated using a separation by implantation of oxygen (SIMOX) process, a wafer bonding process, another applicable method, or a combination thereof. In some other embodiments, the semiconductor substrate 100 includes a multi-layered structure. For example, the semiconductor substrate 100 includes a silicon-germanium layer formed on a bulk silicon layer.

Multiple fin structures 102 are formed on the semiconductor substrate 100, in accordance with some embodiments. For illustration, only one fin structure 102 is shown in FIG. 1. In some embodiments, multiple recesses (or trenches) are formed in the semiconductor substrate 100. As a result, multiple fin structures 102 that protrude from the surface of the semiconductor substrate 100 are formed or defined between the recesses (or trenches). In some embodiments, one or more photolithography and etching processes are used to form the recesses (or trenches). In some embodiments, the fin structures 102 are in direct contact with the semiconductor substrate 100.

However, embodiments of the disclosure have many variations and/or modifications. In some other embodiments, the fin structures 102 are not in direct contact with the semiconductor substrate 100. One or more other material layers (not shown in FIG. 1) may be formed between the semiconductor substrate 100 and the fin structures 102. For example, a dielectric layer is formed between the semiconductor substrate 100 and the fin structures 102.

Afterwards, isolation features (not shown in FIG. 1) are formed in the recesses to surround a lower portion of the fin structures 102, in accordance with some embodiments. The isolation features are used to define and electrically isolate various device elements formed in and/or over the semiconductor substrate 100. In some embodiments, the isolation features include shallow trench isolation (STI) features, local oxidation of silicon (LOCOS) features, another suitable isolation feature, or a combination thereof.

In some embodiments, each of the isolation features has a multi-layer structure. In some embodiments, the isolation features are made of a dielectric material. The dielectric material may include silicon oxide, silicon nitride, silicon oxynitride, fluoride-doped silicate glass (FSG), low-K dielectric material, another suitable material, or a combination thereof. In some embodiments, an STI liner (not shown) is formed to reduce crystalline defects at the interface between the semiconductor substrate 100 and the isolation features. Similarly, the STI liner may also be used to reduce crystalline defects at the interface between the fin structures and the isolation features.

In some embodiments, a dielectric material layer is deposited over the semiconductor substrate 100. The dielectric material layer covers the fin structures 102 and fills the recesses between the fin structures. In some embodiments, the dielectric material layer is deposited using a flowable chemical vapor deposition (FCVD) process, an atomic layer deposition (ALD) process, a spin coating process, one or more other applicable processes, or a combination thereof.

In some embodiments, a planarization process is performed to thin down the dielectric material layer and to expose a mask layer or a stop layer covering top surfaces of the fin structures 102. The planarization process may include a chemical mechanical polishing (CMP) process, a grinding process, an etching process, a dry polishing process, one or more other applicable processes, or a combination thereof. Afterwards, the dielectric material layer is etched back to below the top of the fin structures 102. As a result, the remaining portions of the dielectric material layer form the isolation features. The fin structures 102 protrude from the top surface of the isolation features.

Figure 2:
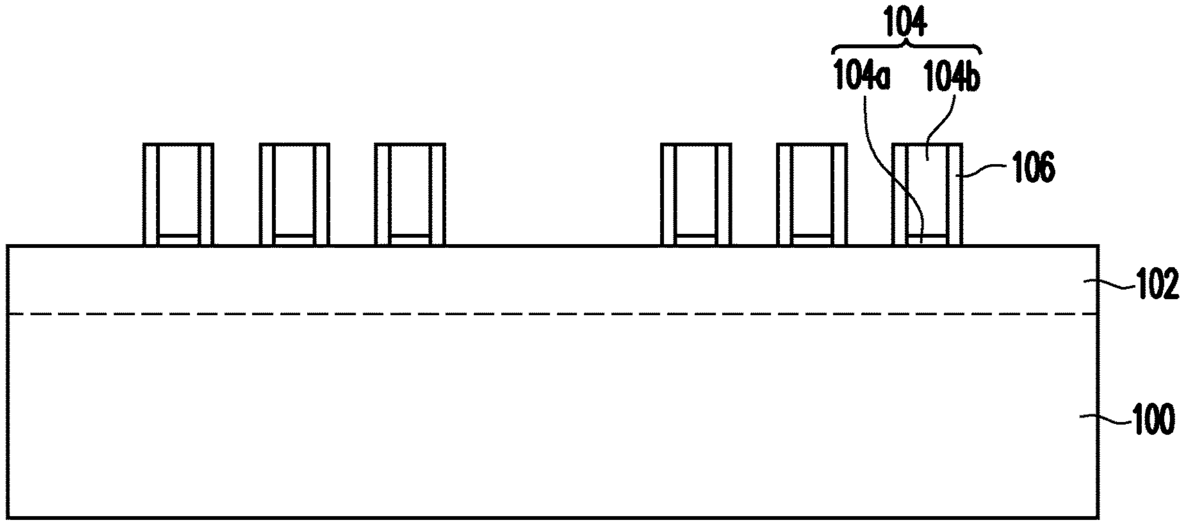

Referring to FIG. 2, dummy gate stacks 104 are formed over the semiconductor substrate 100, in accordance with some embodiments. The dummy gate stacks 104 partially cover and wrap around the fin structures 102, respectively. As shown in FIG. 2, the dummy gate stacks 104 may be substantially identical in width. In some alternative embodiments, the dummy gate stacks 104 may be different in width.

In some embodiments, each of the dummy gate stacks 104 has a dummy gate dielectric layer **104*a* and a dummy gate electrode 104*b*. The dummy gate dielectric layer 104*a* may be made of or include silicon oxide, silicon oxynitride, silicon nitride, one or more other suitable materials, or a combination thereof. The dummy gate electrode 104*b* may be made of or include a semiconductor material, such as polysilicon. In some embodiments, a dielectric material layer and a gate electrode material layer are sequentially deposited over the semiconductor substrate 100 and the fin structures 102. The dielectric material layer may be deposited using a CVD process, an ALD process, a thermal oxidation process, a physical vapor deposition (PVD) process, one or more other applicable processes, or a combination thereof. Afterwards, one or more photolithography processes and one or more etching processes may be used to partially remove the dielectric material layer and the gate electrode material layer. As a result, the remaining portions 104*a* and 104*b* of the dielectric material layer and the gate electrode material layer form the dummy gate stacks 104**.

Afterwards, spacer elements 106 are formed over sidewalls of the dummy gate stacks 104, as shown in FIG. 2 in accordance with some embodiments. The spacer elements 106 may be used to protect the dummy gate stacks 104 and assist in subsequent processes for forming source/drain features and/or metal gates. In some embodiments, the spacer elements 106 are made of or include a dielectric material. The dielectric material may include silicon nitride, silicon oxynitride, silicon oxide, silicon carbide, one or more other suitable materials, or a combination thereof.

In some embodiments, a dielectric material layer is deposited over the semiconductor substrate 100, the fin structures 102, and the dummy gate stacks 104. The dielectric material layer may be deposited using a CVD process, an ALD process, a spin coating process, one or more other applicable processes, or a combination thereof. Afterwards, the dielectric material layer is partially removed using an etching process, such as an anisotropic etching process. As a result, the remaining portions of the dielectric material layer over the sidewalls of the dummy gate stacks 104 form the spacer elements 106.

Figure 3:
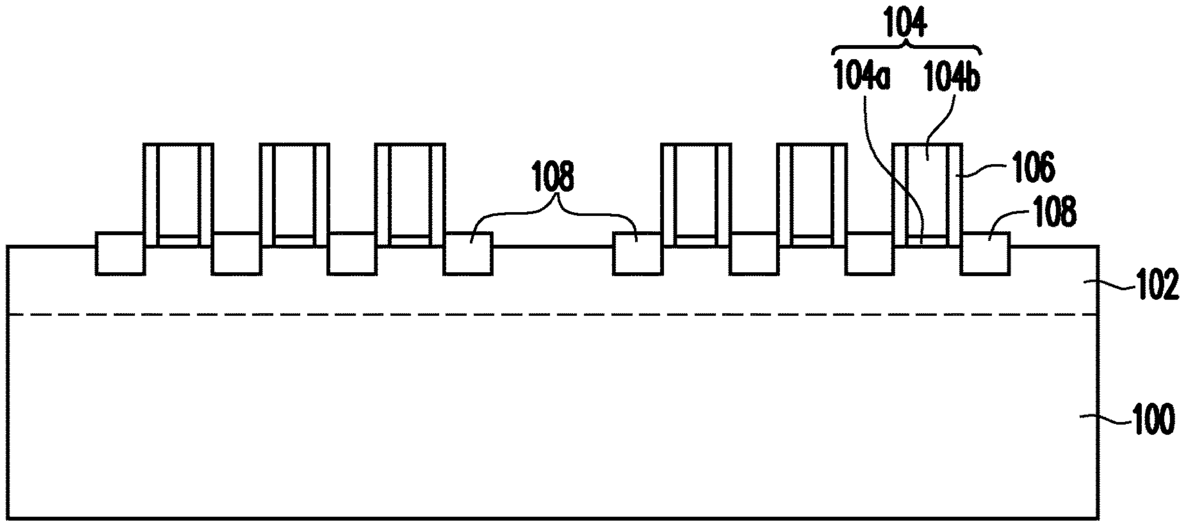

Referring to FIG. 3, epitaxial structures 108 are respectively formed over the fin structures 102, in accordance with some embodiments. The epitaxial structures 108 may function as source/drain features. In some embodiments, the portions of the fin structures 102 that are not covered by the dummy gate stacks 104 and the spacer elements 106 are recessed before the formation of the epitaxial structures 108. In some embodiments, the recesses laterally extend towards the channel regions under the dummy gate stacks 104. For example, portions of the recesses are directly below the spacer elements 106. Afterwards, one or more semiconductor materials are epitaxially grown on sidewalls and bottoms of the recesses to form the epitaxial structures 108. In some embodiments, both the epitaxial structures 108 are p-type semiconductor structures. In some other embodiments, both the epitaxial structures 108 are n-type semiconductor structures. In some other embodiments, one of the epitaxial structures 108 is a p-type semiconductor structure, and another one is an n-type semiconductor structure. A p-type semiconductor structure may include epitaxially grown silicon germanium or silicon germanium doped with boron. An n-type semiconductor structure may include epitaxially grown silicon, epitaxially grown silicon carbide (SiC), epitaxially grown silicon phosphide (SiP), or another suitable epitaxially grown semiconductor material. In some embodiments, the epitaxial structures 108 are formed by an epitaxial process. In some other embodiments, the epitaxial structures 108 are formed by separate processes, such as separate epitaxial growth processes. The epitaxial structures 108 may be formed by using a selective epitaxial growth (SEG) process, a CVD process (e.g., a vapor-phase epitaxy (VPE) process, a low pressure chemical vapor deposition (LPCVD) process, and/or an ultra-high vacuum CVD (UHV-CVD) process), a molecular beam epitaxy process, one or more other applicable processes, or a combination thereof.

In some embodiments, one or both of the epitaxial structures 108 are doped with one or more suitable dopants. For example, the epitaxial structures 108 are SiGe source/drain features doped with boron (B), indium (In), or another suitable dopant. Alternatively, in some other embodiments, one or both of the epitaxial structures 108 are Si source/drain features doped with phosphor (P), antimony (Sb), or another suitable dopant.

In some embodiments, the epitaxial structures 108 are doped in-situ during their epitaxial growth. In some other embodiments, the epitaxial structures 108 are not doped during the growth of the epitaxial structures 108. Instead, after the formation of the epitaxial structures 108, the epitaxial structures 108 are doped in a subsequent process. In some embodiments, the doping is achieved by using an ion implantation process, a plasma immersion ion implantation process, a gas and/or solid source diffusion process, one or more other applicable processes, or a combination thereof. In some embodiments, one or more annealing processes are performed to activate the dopants in the epitaxial structures 108. For example, a rapid thermal annealing process is used.

Figure 4:
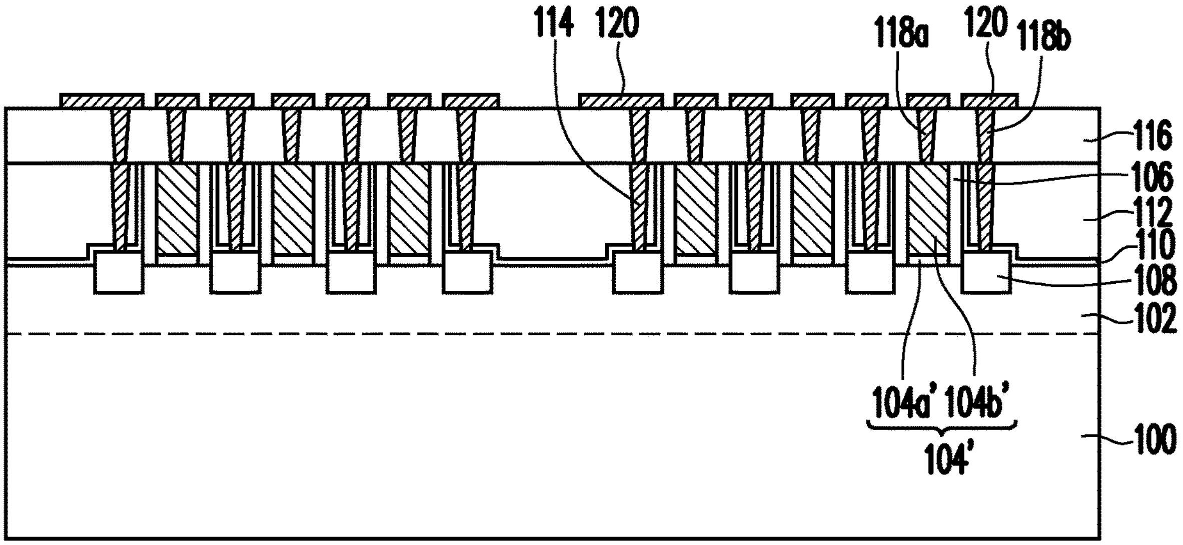

As shown in FIG. 4, an etch stop layer 110 and a dielectric layer 112 are sequentially deposited over the semiconductor substrate 100 and the epitaxial structures 112, in accordance with some embodiments. The etch stop layer 110 may conformally extend along the surfaces of the spacer elements 106 and the epitaxial structures 108. The dielectric layer 112 covers the stop layer 110 and surrounds the spacer elements 110 and the dummy gate stacks 104. The etch stop layer 110 may be made of or include silicon nitride, silicon oxynitride, silicon carbide, one or more other suitable materials, or a combination thereof. In some embodiments, the etch stop layer 110 is deposited over the semiconductor substrate 100 and the dummy gate stacks 104 using a CVD process, an ALD process, a PVD process, one or more other applicable processes, or a combination thereof. The dielectric layer 112 may be made of or include silicon oxide, silicon oxynitride, borosilicate glass (BSG), phosphoric silicate glass (PSG), borophosphosilicate glass (BPSG), fluorinated silicate glass (FSG), low-k material, porous dielectric material, one or more other suitable materials, or a combination thereof. In some embodiments, the dielectric layer 112 is deposited over the etch stop layer 110 and the dummy gate stacks 104 using a CVD process, an ALD process, a FCVD process, a PVD process, one or more other applicable processes, or a combination thereof.

Afterwards, a planarization process is used to remove upper portions of the dielectric layer 112, the etch stop layer 110, the spacer elements 106, and the dummy gate stacks 104. As a result, the top surfaces of the dielectric layer 112, the etch stop layer 110, the spacer elements 106, and the dummy gate stacks 104 are substantially level with each other, which benefits subsequent fabrication processes. The planarization process may include a CMP process, a grinding process, an etching process, a dry polishing process, one or more other applicable processes, or a combination thereof.

As shown in FIG. 3 and FIG. 4, the dummy gate stacks 104 each including the dummy gate dielectric layer 104*a* and the dummy gate electrode 104*b* are removed and replaced by metal gate stacks 104' each including a gate dielectric layer 104*a*' and a gate electrode 104*b*' by a gate replacement process. In some embodiments, the gate dielectric layer 104*a*' is made of or includes a dielectric material with high dielectric constant (high-K). The gate dielectric layer 104*a*' may be made of or include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, one or more other suitable high-K materials, or a combination thereof. The gate dielectric layer 104*a*' may be deposited using an ALD process, a CVD process, one or more other applicable processes, or a combination thereof. In some embodiments, the formation of the gate dielectric layer 104*a*' involves a thermal operation.

In some embodiments, during the gate replacement process, an interfacial layer (not shown) is formed on the exposed surfaces of the fin structures 102 before the formation of the gate dielectric layer 104*a*'. The interfacial layer may be used to improve adhesion between the gate dielectric layer 104*a*' and the fin structures 102. The interfacial layer may be made of or include a semiconductor oxide material such as silicon oxide or germanium oxide. The interfacial layer may be formed using a thermal oxidation process, an oxygen-containing plasma operation, one or more other applicable processes, or a combination thereof.

The gate electrode 104*b*' may include a work function layer and a conductive filling layer, in accordance with some embodiments. The work function layer may be used to provide the desired work function for transistors to enhance device performance including improved threshold voltage. In some embodiments, the work function layer is used for forming an NMOS device. The work function layer is an n-type work function layer. The n-type work function layer is capable of providing a work function value suitable for the device, such as equal to or less than about 4.5 eV. The n-type work function layer may include metal, metal carbide, metal nitride, or a combination thereof. For example, the n-type work function layer includes titanium nitride, tantalum, tantalum nitride, one or more other suitable materials, or a combination thereof. In some other embodiments, the n-type work function layer is an aluminum-containing layer. The aluminum-containing layer may be made of or include TiAlC, TiAlO, TiAlN, one or more other suitable materials, or a combination thereof.

In some embodiments, the work function layer is used for forming a PMOS device. The work function layer is a p-type work function layer. The p-type work function layer is capable of providing a work function value that is suitable for the device, such as equal to or greater than about 4.8 eV. The p-type work function layer may include metal, metal carbide, metal nitride, other suitable materials, or a combination thereof. For example, the p-type metal includes tantalum nitride, tungsten nitride, titanium, titanium nitride, other suitable materials, or a combination thereof.

The work function layer may also be made of or include hafnium, zirconium, titanium, tantalum, aluminum, metal carbides (e.g., hafnium carbide, zirconium carbide, titanium carbide, aluminum carbide), aluminides, ruthenium, palladium, platinum, cobalt, nickel, conductive metal oxides, or a combination thereof. The thickness and/or the compositions of the work function layer 122 may be fine-tuned to adjust the work function level. For example, a titanium nitride layer is used as a p-type work function layer or an n-type work function layer, depending on the thickness and/or the compositions of the titanium nitride layer.

The work function layer may be deposited over the gate dielectric layer 104*a*' using an ALD process, a CVD process, a PVD process, an electroplating process, an electroless plating process, one or more other applicable processes, or a combination thereof.

In some embodiments, a barrier layer is formed before the formation of the work function layer to interface the gate dielectric layer 104*a*' with the subsequently formed work function layer. The barrier layer may also be used to prevent diffusion between the gate dielectric layer 104*a*' and the barrier of the gate electrode 104*b*'. The barrier layer may be made of or include a metal-containing material. The metal-containing material may include titanium nitride, tantalum nitride, one or more other suitable materials, or a combination thereof. The barrier layer may be deposited using an ALD process, a CVD process, a PVD process, an electroplating process, an electroless plating process, one or more other applicable processes, or a combination thereof.

The conductive filling layer may be made of or includes a metal material. The metal material may include tungsten, aluminum, copper, cobalt, one or more other suitable materials, or a combination thereof. The conductive filling layer may be deposited using a CVD process, an ALD process, a PVD process, an electroplating process, an electroless plating process, one or more other applicable processes, or a combination thereof. In some embodiments, a blocking layer is formed over the work function layer before the formation of the conductive filling layer. The blocking layer may be used to prevent the subsequently formed conductive filling layer from diffusing or penetrating into the work function layer. The blocking layer may be made of or include tantalum nitride, titanium nitride, one or more other suitable materials, or a combination thereof. The blocking layer may be deposited using an ALD process, a PVD process, an electroplating process, an electroless plating process, one or more other applicable processes, or a combination thereof.

After performing the gate replacement process, manufacturing processes of front end of line (FEOL) is accomplished. After performing the gate replacement process, contacts 114, a dielectric layer 116, contacts 118*a*, contacts 118*b*, and conductive wirings 120 are formed over the semiconductor substrate 100.

The dielectric layer 112 and the etch stop layer 110 may be patterned by any suitable method. For example, the dielectric layer 112 and the etch stop layer 110 are patterned using photolithography process. After patterning the dielectric layer 112 and the etch stop layer 110, through holes are formed in the dielectric layer 112 and the etch stop layer 110 such that portions of the epitaxial structures 108 are exposed. A conductive material (e.g., copper or other suitable metallic materials) may be deposited over the dielectric layer 112 and fill into the through holes defined in the dielectric layer 112 and the etch stop layer 110. The conductive material may be deposited using a CVD process or other applicable processes. In some embodiments, a planarization process is performed to remove the deposited conductive material until the top surface of the dielectric layer 112 is revealed. The planarization process may include a chemical mechanical polishing (CMP) process, a grinding process, an etching process, a dry polishing process, one or more other applicable processes, or a combination thereof. As shown in FIG. 4, after performing the planarization process, the contacts 114 are formed to penetrated through the dielectric layer 112 and the etch stop layer 110, and the contacts 114 may serve as bottom portions of source/drain contacts which are electrically connected to the epitaxial structures 108 (i.e. the source/drain features 108).

The dielectric layer 116 may be deposited over the dielectric layer 112. In some embodiments, the dielectric layer 116 is deposited over the dielectric layer 112 using a CVD process, an ALD process, a FCVD process, a PVD process, one or more other applicable processes, or a combination thereof. The dielectric layer 116 may be made of or include silicon oxide, silicon oxynitride, BSG, PSG, BPSG, FSG, low-k material, porous dielectric material, one or more other suitable materials, or a combination thereof. The dielectric layer 116 may be patterned by any suitable method. For example, the dielectric layer 116 is patterned using photolithography process. After patterning the dielectric layer 116, through holes are formed in the dielectric layer 116 such that portions of the contacts 114 and portions of the gate electrode 104*b*' are exposed. A conductive material (e.g., copper or other suitable metallic materials) may be deposited over the dielectric layer 116 and fill into the through holes defined in the dielectric layer 116. The conductive material may be deposited using a CVD process or other applicable processes. In some embodiments, a planarization process is performed to remove the deposited conductive material until the top surface of the dielectric layer 116 is revealed. The planarization process may include a chemical mechanical polishing (CMP) process, a grinding process, an etching process, a dry polishing process, one or more other applicable processes, or a combination thereof. As shown in FIG. 4, after performing the planarization process, the contacts 118*a* and 118*b* are formed to penetrated through the dielectric layer 116, the contact 118*a* may serve as gate contacts which are electrically connected to the gate electrode 104*b*', and the contacts 118*b* land on the contacts 114 and may serve as upper portions of source/drain contacts.

The conductive wirings 120 may be formed on the dielectric layer 116 to electrically connected to the contacts 118*a* and 118*b*. A conductive material (e.g., copper or other suitable metallic materials) may be deposited on the top surfaces of the dielectric layer 116, and the conductive material may be patterned by any suitable method. For example, the conductive material is deposited using a CVD process or other applicable processes, and the conductive material is patterned using photolithography process.

After forming the conductive wirings 120, manufacturing processes of middle end of line (MEOL) are accomplished, and manufacturing processes of back end of line (BEOL) are performed.

Figure 5:
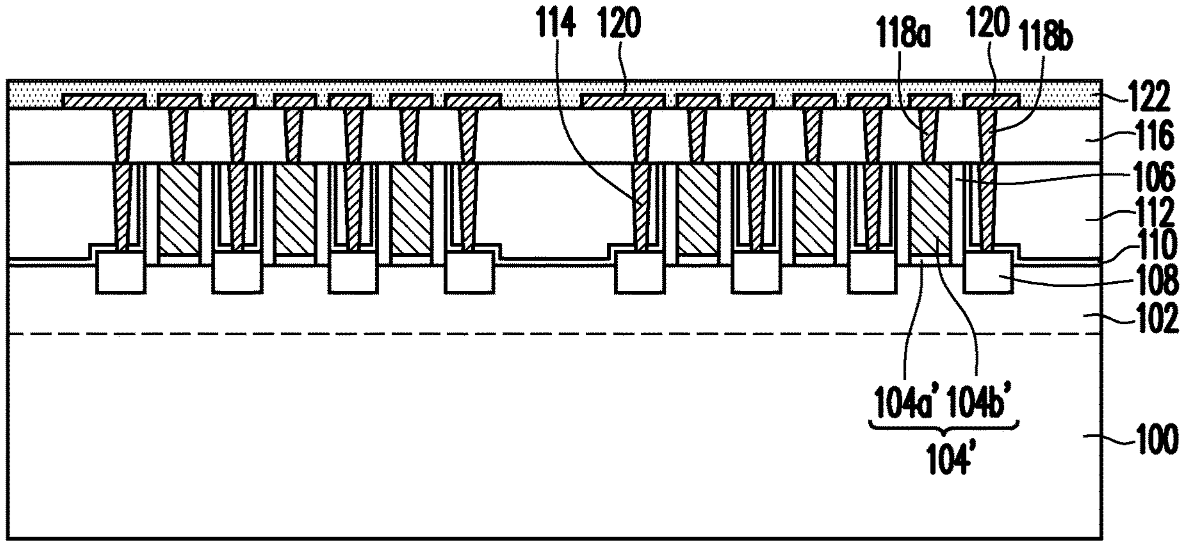

Referring to FIG. 5, a buffer layer 122 is formed over the dielectric layer 116 to cover the conductive wirings 120. The buffer layer 122 may be deposited over the dielectric layer 116 using a CVD process, an ALD process, a FCVD process, a PVD process, one or more other applicable processes, or a combination thereof. The buffer layer 122 may be made of or include silicon oxide, silicon oxynitride, BSG, PSG, BPSG, FSG, low-k material, porous dielectric material, one or more other suitable materials, or a combination thereof. The buffer layer 122 may be a planarization layer having a flat top surface and assist in subsequent processes for forming an interconnect structure including thin film transistors and memory devices embedded therein. In some embodiments, the buffer layer 122 may serve as a diffusion barrier layer for preventing contamination resulted from manufacturing processes of back end of line (BEOL).

Figure 6:
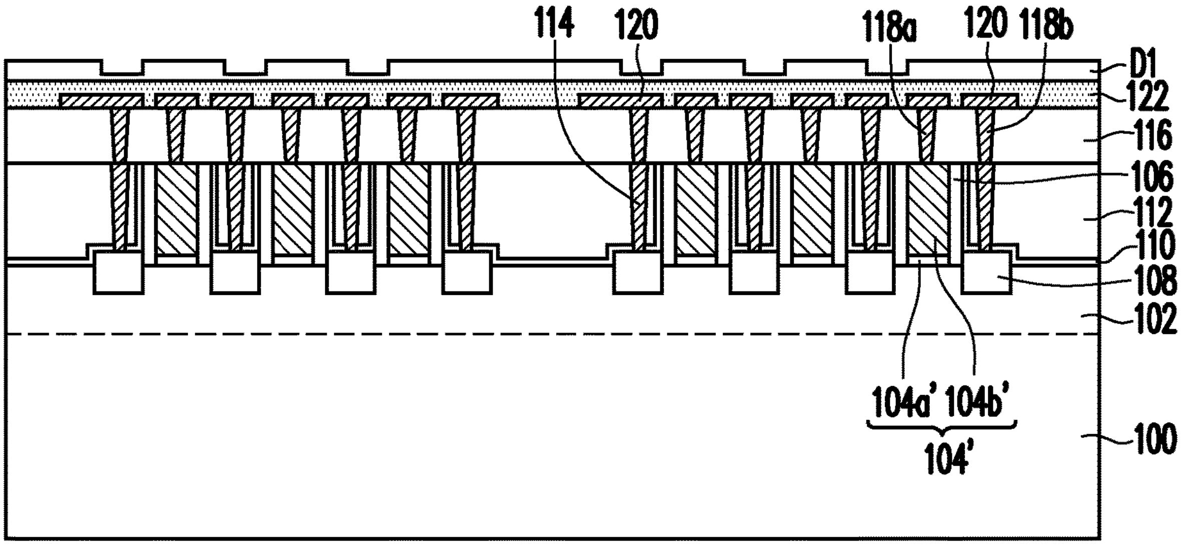

Referring to FIG. 6, a dielectric layer D1 having trenches TR1 formed thereon are formed over the buffer layer 122. In some embodiments, the dielectric layer D1 may be formed on and in contact with the buffer layer 122 directly. In some alternative embodiments, the dielectric layer D1 may be formed above the buffer layer 122, and the dielectric layer D1 may be spaced apart from the buffer layer 122 by other dielectric layers. The trenches TR1 formed on the dielectric layer D1 define dimension (e.g., width, length and thickness) and distribution of the subsequently formed bottom gates. The dielectric layer D1 may be deposited over the buffer layer 122 using a CVD process, an ALD process, a FCVD process, a PVD process, one or more other applicable processes, or a combination thereof. The dielectric layer D1 may be made of or include silicon oxide, silicon oxynitride, BSG, PSG, BPSG, FSG, low-k material, porous dielectric material, one or more other suitable materials, or a combination thereof. The trenches TR1 of the dielectric layer D1 may be formed by any suitable patterning method. For example, the dielectric layer D1 is patterned using photolithography process. In some embodiments, as illustrated in FIG. 6, the trenches TR1 formed on the dielectric layer D1 have a depth less than the thickness of the dielectric layer D1. In some alternative embodiments, not illustrated in figures, the trenches TR1 formed on the dielectric layer D1 have a depth substantially equal to the thickness of the dielectric layer D1 such that portions of the buffer layer 122 are revealed by the trenches TR1.

Figure 7:
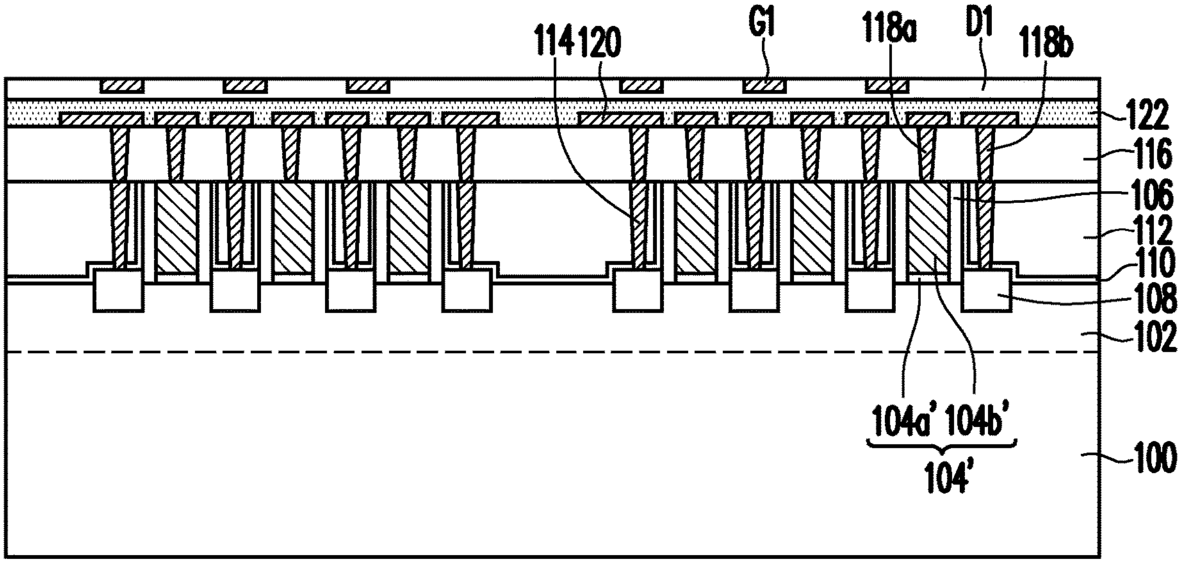

Referring to FIG. 7, after patterning the dielectric layer D1, bottom gates G1 of driving transistors (e.g., thin film transistors) are formed on the dielectric layer D1. A conductive material (e.g., copper or other suitable metallic materials) may be deposited over the dielectric layer D1 and fill into the trenches TR1 defined in the dielectric layer D1. The conductive material may be deposited using a CVD process or other applicable processes. In some embodiments, the conductive material for forming the bottom gates G1 includes a single metal layer. In some alternative embodiments, the conductive material for forming the bottom gates G1 includes laminated metal layers. A planarization process may be performed to remove the deposited conductive material until the top surface of the dielectric layer D1 is revealed such that the bottom gates G1 are formed in the trenches TR1. The top surfaces of the bottom gates G1 may be flat surfaces. In some alternative embodiments, the top surfaces of the bottom gates G1 are concave surfaces or convex surfaces. The planarization process may include a chemical mechanical polishing (CMP) process, a grinding process, an etching process, a dry polishing process, one or more other applicable processes, or a combination thereof. In some embodiments, as illustrated in FIG. 7, the top surfaces of the bottom gates G1 are substantially leveled with the top surface of the dielectric layer D1. In some alternative embodiments, not illustrated in figures, a level height difference due to grinding selectivity or etching selectivity is between the top surfaces of the bottom gates G1 and the top surface of the dielectric layer D1.

In some embodiments, the bottom gates G1 are portions of word lines; in other words, the portions of word lines may provide function of the bottom gates G1. In some alternative embodiments, the bottom gates G1 are not portions of word lines, the bottom gates G1 are separated from one another, and the bottom gates G1 are electrically connected to the word lines by conductive vias. The bottom gates G1 are classified into groups, and each group of the bottom gates G1 are electrically connected to one of the word lines respectively.

Figure 8:
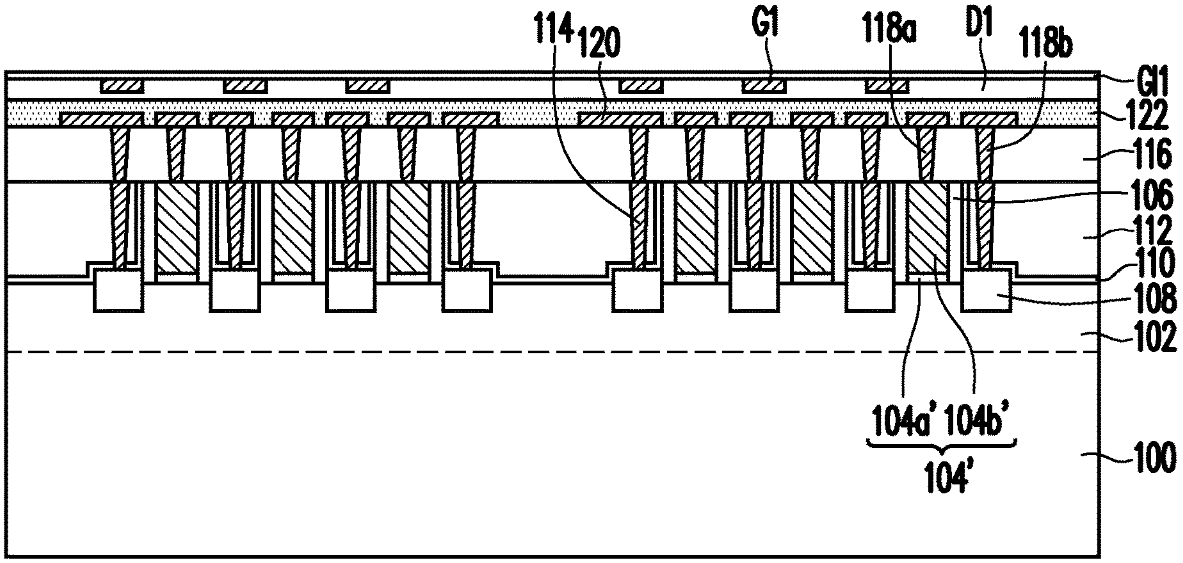

Referring to FIG. 8, a gate insulating layer GI1 is formed to cover the dielectric layer D1 and the bottom gates G1. The gate insulating layer GI1 may be deposited over the dielectric layer D1 and the bottom gates G1 using a CVD process, an ALD process, a FCVD process, a PVD process, one or more other applicable processes, or a combination thereof. The gate insulating layer GI1 may be made of or include silicon oxide, silicon oxynitride, aluminum oxide ($Al_2O_3$), BSG, PSG, BPSG, FSG, low-k material, high-k material, porous dielectric material, one or more other suitable materials, or a combination thereof. In some embodiments, the gate insulating layer GI1 includes a single insulating layer. In some alternative embodiments, the gate insulating layer GI1 includes laminated insulating layers.

Figure 9:
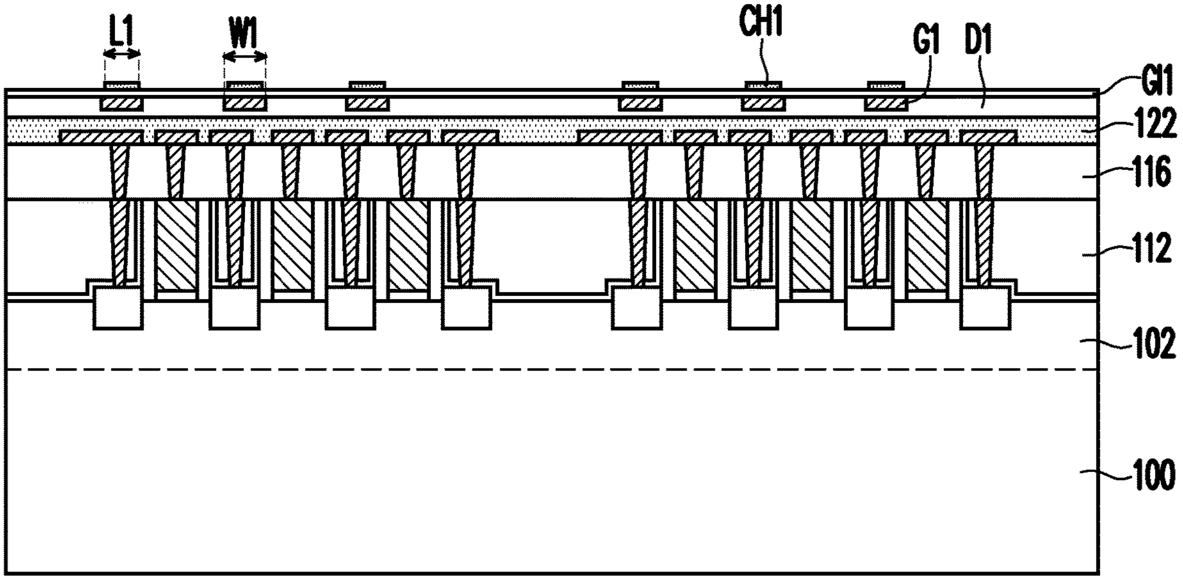

Referring to FIG. 9, semiconductor channel layers CH1 are formed over the gate insulating layer GI1. The semiconductor channel layers CH1 may be island-shaped channel layers which are separated from one another. In some embodiments, the semiconductor channel layers CH1 are oxide semiconductor patterns. An oxide semiconductor material layer may be deposited over the gate insulating layer GI1 using a CVD process, an ALD process, a FCVD process, a PVD process, one or more other applicable processes, or a combination thereof. The oxide semiconductor material may be or include amorphous indium gallium zinc oxide (IGZO), indium zinc oxide (IZO), indium gallium oxide, other applicable materials, or a combination thereof. The oxide semiconductor material layer may be formed by any suitable patterning method. For example, the oxide semiconductor material layer is patterned using photolithography process. In some embodiments, as illustrated in FIG. 9, the semiconductor channel layers CH1 are formed above the bottom gates G1, and the semiconductor channel layers CH1 are spaced apart from the bottom gates G1 by the gate insulating layer GI1. In some embodiments, as illustrated in FIG. 9, channel length L1 of the semiconductor channel layers CH1 is less than gate width W1 of the bottom gates G1. In some embodiments, not illustrated in figures, channel length L1 of the semiconductor channel layers CH1 is substantially equal to gate width W1 of the bottom gates G1.

Figure 10:
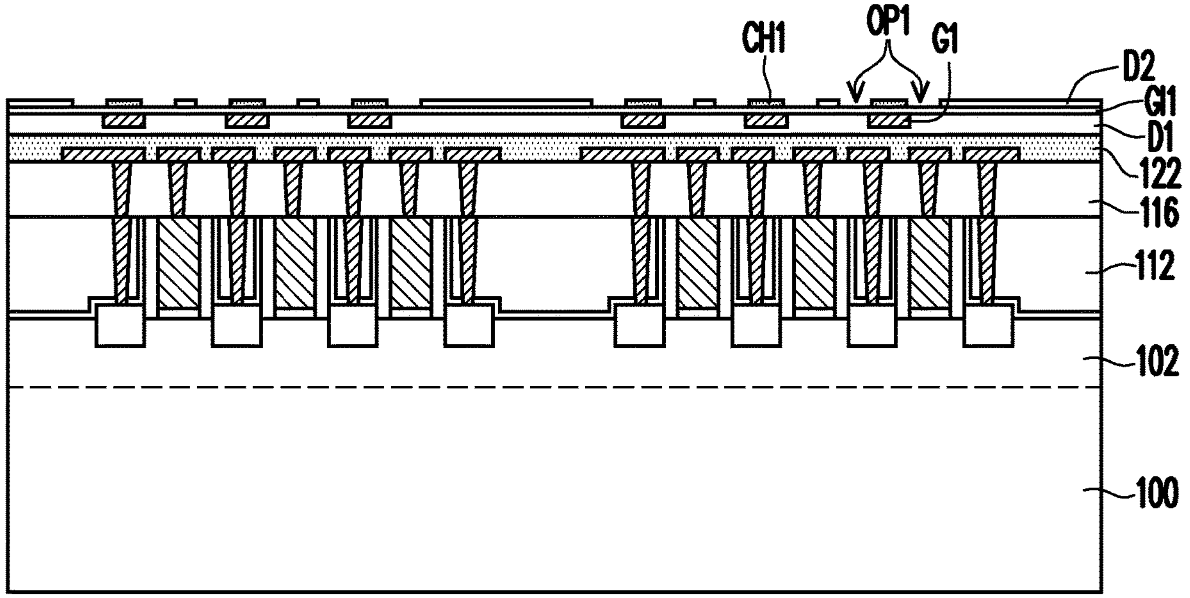

Referring to FIG. 10, a dielectric layer D2 having openings OP1 formed therein is formed over the gate insulating layer GI1. The openings OP1 formed in the dielectric layer D2 define dimension (e.g., width, length and thickness) and distribution of the subsequently formed source electrodes and drain electrodes. The semiconductor channel layers CH1 are located in the openings OP1 of the dielectric layer D2. The dielectric layer D2 may be deposited over the gate insulating layer GI1 and the semiconductor channel layers CH1 using a CVD process, an ALD process, a FCVD process, a PVD process, one or more other applicable processes, or a combination thereof. The dielectric layer D2 may be made of or include silicon oxide, silicon oxynitride, BSG, PSG, BPSG, FSG, low-k material, porous dielectric material, one or more other suitable materials, or a combination thereof. The openings OP1 of the dielectric layer D2 may be formed by any suitable patterning method. For example, the dielectric layer D2 is patterned using photolithography process. In some embodiments, as illustrated in FIG. 10, the openings OP1 formed in the dielectric layer D2 have a depth substantially equal to the thickness of the dielectric layer D2 such that the semiconductor channel layers CH1 and portions of the gate insulating layer GI1 are revealed by the openings OP1.

Figure 11:
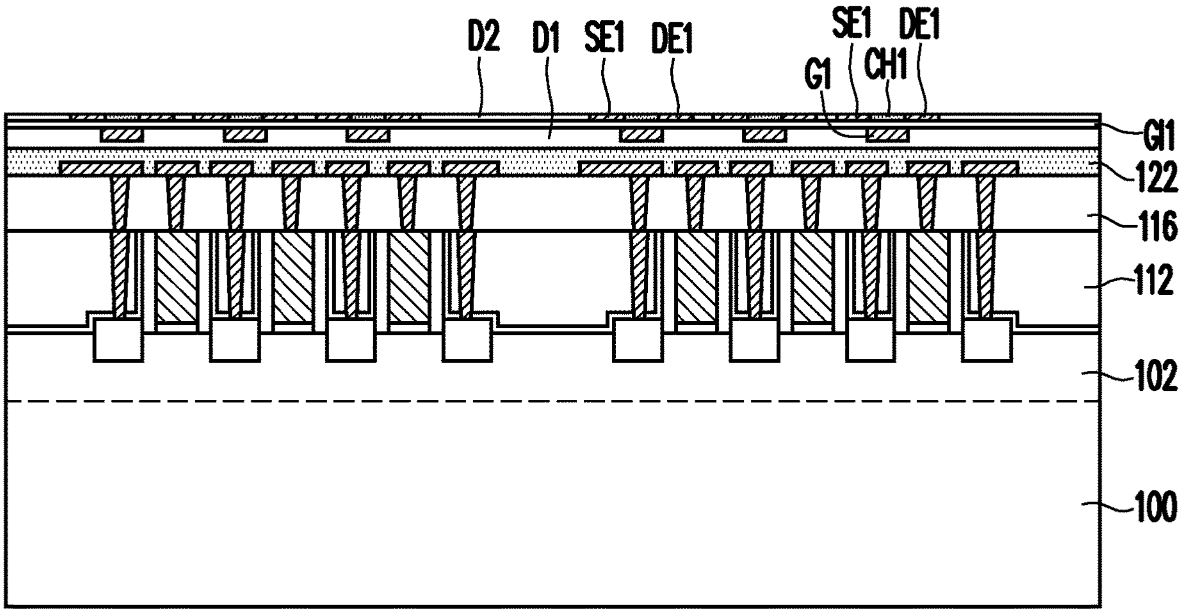

Referring to FIG. 10 and FIG. 11, after patterning the dielectric layer D2, source electrodes SE1 and drain electrodes DE1 of driving transistors (e.g., thin film transistors)

are formed on the gate insulating layer GI1 and fill in the openings OP1 of dielectric layer D2. A conductive material (e.g., copper or other suitable metallic materials) may be deposited over the dielectric layer D2 and fill into the openings OP1 defined in the dielectric layer D2. The conductive material may be deposited using a CVD process or other applicable processes. In some embodiments, the conductive material for forming the source electrodes SE1 and the drain electrodes DE1 includes a single metal layer. In some alternative embodiments, the conductive material for forming the source electrodes SE1 and the drain electrodes DE1 includes laminated metal layers. A planarization process may be performed to remove the deposited conductive material until the top surface of the dielectric layer D2 is revealed such that the source electrodes SE1 and the drain electrodes DE1 are formed in the openings OP1. The planarization process may include a chemical mechanical polishing (CMP) process, a grinding process, an etching process, a dry polishing process, one or more other applicable processes, or a combination thereof. In some embodiments, as illustrated in FIG. 11, the top surfaces of the source electrodes SE1 and drain electrodes DE1 are substantially leveled with the top surface of the dielectric layer D2. In some alternative embodiments, not illustrated in figures, a level height difference due to grinding selectivity or etching selectivity is between the top surfaces of the source electrodes SE1 and the drain electrodes DE1 and the top surface of the dielectric layer D2.

The source electrodes SE1 and drain electrodes DE1 are disposed at two opposite sides of the respective semiconductor channel layers CH1. The source electrodes SE1 and drain electrodes DE1 are in contact with sidewalls of the respective semiconductor channel layers CH1. In some embodiments, as illustrated in FIG. 11, the thickness of the source electrodes SE1 and drain electrodes DE1 is substantially equal to the thickness of the semiconductor channel layers CH1. In some embodiments, not illustrated in figures, a level height difference due to grinding selectivity or etching selectivity is between the top surfaces of the source electrodes SE1 and the drain electrodes DE1 and the top surfaces of the semiconductor channel layers CH1.

In some embodiments, as illustrated in FIG. 11, the top surfaces of the semiconductor channel layers CH1 are substantially leveled with the top surface of the dielectric layer D2. In some alternative embodiments, not illustrated in figures, a level height difference due to grinding selectivity or etching selectivity is between the top surfaces of the semiconductor channel layers CH1 and the top surface of the dielectric layer D2.

Figure 12:
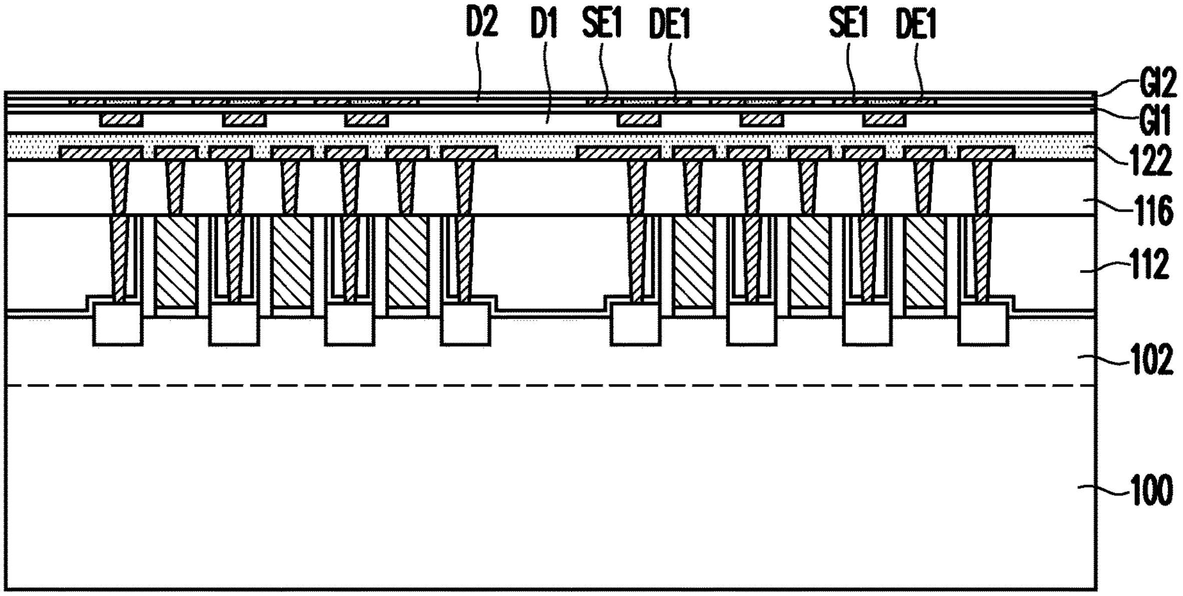

Referring to FIG. 12, a gate insulating layer GI2 is formed to cover the semiconductor channel layers CH1, the source electrodes SE1, the drain electrodes DE1 and the dielectric layer D2. The gate insulating layer GI2 may be deposited over the dielectric layer D2 using a CVD process, an ALD process, a FCVD process, a PVD process, one or more other applicable processes, or a combination thereof. The gate insulating layer GI2 may be made of or include silicon oxide, silicon oxynitride, aluminum oxide ($Al_2O_3$), BSG, PSG, BPSG, FSG, low-k material, porous dielectric material, one or more other suitable materials, or a combination thereof. In some embodiments, the gate insulating layer GI2 includes a single insulating layer. In some alternative embodiments, the gate insulating layer GI2 includes laminated insulating layers.

In some embodiments, the configuration (e.g., thickness and/or material) of the gate insulating layer GI2 is the same as the configuration (e.g., thickness and/or material) of the gate insulating layer GI1. In some alternative embodiments, the configuration (e.g., thickness and/or material) of the gate insulating layer GI2 is different from the configuration (e.g., thickness and/or material) of the gate insulating layer GI1.

Figure 13:
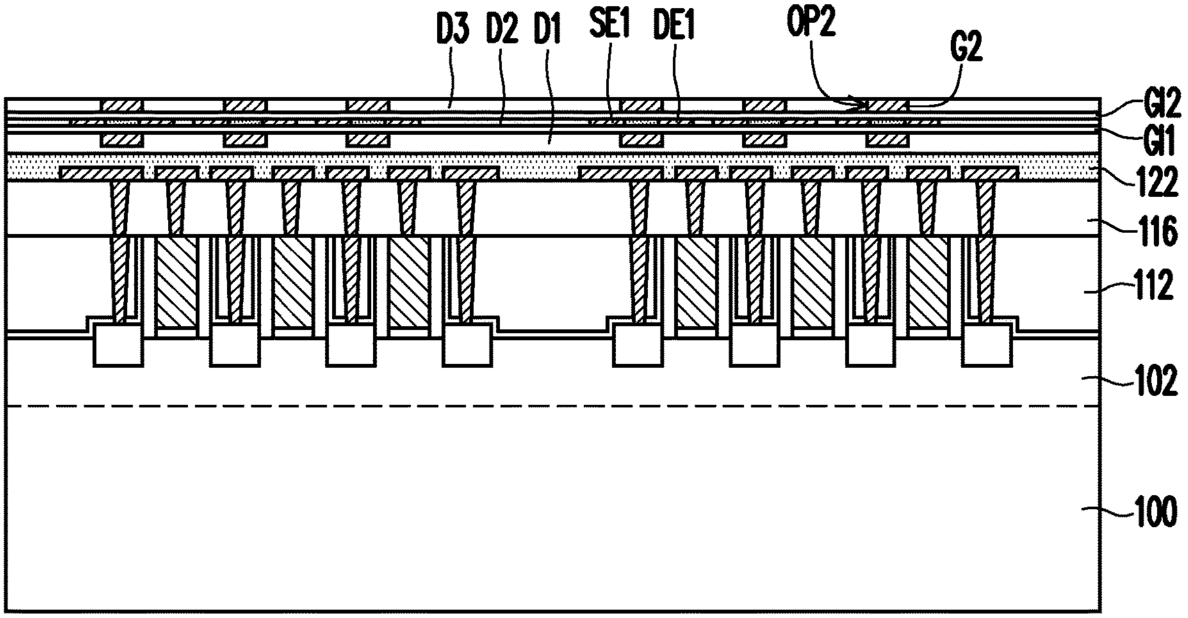

Referring to FIG. 13, a dielectric layer D3 having openings OP2 formed therein is formed over the gate insulating layer GI2. The openings OP2 formed in the dielectric layer D3 define dimension (e.g., width, length and thickness) and distribution of the subsequently formed middle gates G2. The dielectric layer D3 may be deposited over the gate insulating layer GI2 using a CVD process, an ALD process, a FCVD process, a PVD process, one or more other applicable processes, or a combination thereof. The dielectric layer D3 may be made of or include silicon oxide, silicon oxynitride, BSG, PSG, BPSG, FSG, low-k material, porous dielectric material, one or more other suitable materials, or a combination thereof. The openings OP2 of the dielectric layer D3 may be formed by any suitable patterning method. For example, the dielectric layer D3 is patterned using photolithography process. In some embodiments, as illustrated in FIG. 13, the openings OP2 formed in the dielectric layer D3 have a depth substantially equal to the thickness of the dielectric layer D3 such that the gate insulating layer GI2 is revealed by the openings OP2.

After patterning the dielectric layer D3, middle gates G2 of driving transistors (e.g., thin film transistors) are formed on the dielectric layer D3. A conductive material (e.g., copper or other suitable metallic materials) may be deposited over the dielectric layer D3 and fill into the openings OP2 defined in the dielectric layer D3. The conductive material may be deposited using a CVD process or other applicable processes. In some embodiments, the conductive material for forming the middle gates G2 includes a single metal layer. In some alternative embodiments, the conductive material for forming the middle gates G2 includes laminated metal layers. A planarization process may be performed to remove the deposited conductive material until the top surface of the dielectric layer D3 is revealed such that the middle gates G2 are formed in the openings OP2. The top surfaces of the middle gates G2 may be flat surfaces. In some alternative embodiments, the top surfaces of the middle gates G2 are concave surfaces or convex surfaces. The planarization process may include a chemical mechanical polishing (CMP) process, a grinding process, an etching process, a dry polishing process, one or more other applicable processes, or a combination thereof. In some embodiments, as illustrated in FIG. 13, the top surfaces of the middle gates G2 are substantially leveled with the top surface of the dielectric layer D3. In some alternative embodiments, not illustrated in figures, a level height difference due to grinding selectivity or etching selectivity is between the top surfaces of the middle gates G2 and the top surface of the dielectric layer D3.

In some embodiments, the middle gates G2 are portions of word lines; in other words, the portions of word lines may provide function of the middle gates G2. In some alternative embodiments, the middle gates G2 are not portions of word lines, the middle gates G2 are separated from one another, and the middle gates G2 are electrically connected to the word lines by conductive vias. The middle gates G2 are classified into groups, and each group of the middle gates G2 are electrically connected to one of the word lines respectively.

Figure 14:
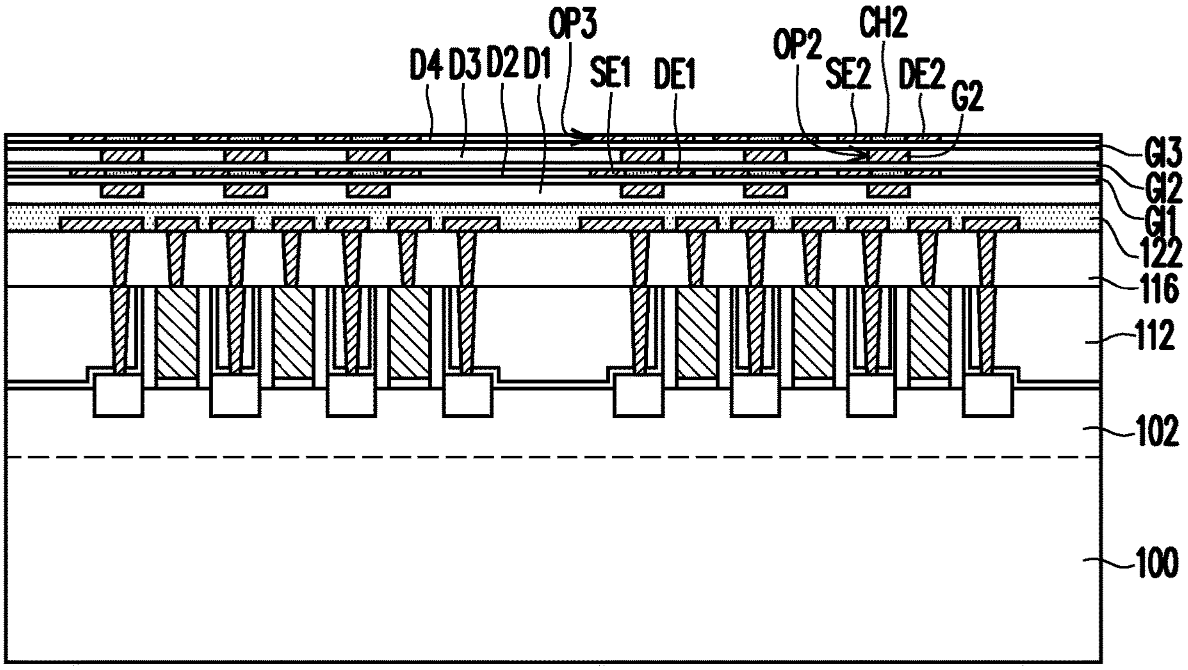

Referring to FIG. 14, a gate insulating layer GI3 is formed to cover the middle gates G2 and the dielectric layer D3. The gate insulating layer GI3 may be deposited over the dielectric layer D3 using a CVD process, an ALD process, a FCVD process, a PVD process, one or more other applicable processes, or a combination thereof. The gate insulating layer GI3 may be made of or include silicon oxide, silicon oxynitride, aluminum oxide ($Al_2O_3$), BSG, PSG, BPSG, FSG, low-k material, high-k material, porous dielectric material, one or more other suitable materials, or a combination thereof. In some embodiments, the gate insulating layer GI3 includes a single insulating layer. In some alternative embodiments, the gate insulating layer GI3 includes laminated insulating layers.

In some embodiments, the configuration (e.g., thickness and/or material) of the gate insulating layer GI3 is the same as the configuration (e.g., thickness and/or material) of the gate insulating layer GI1 or GI2. In some alternative embodiments, the configuration (e.g., thickness and/or material) of the gate insulating layer GI3 is different from the configuration (e.g., thickness and/or material) of the gate insulating layer GI1 or GI2.

Semiconductor channel layers CH2 are formed over the gate insulating layer GI3. The semiconductor channel layers CH2 may be island-shaped channel layers which are separated from one another. In some embodiments, the semiconductor channel layers CH2 are oxide semiconductor patterns. An oxide semiconductor material layer may be deposited over the gate insulating layer GI3 using a CVD process, an ALD process, a FCVD process, a PVD process, one or more other applicable processes, or a combination thereof. The oxide semiconductor material may be or include amorphous indium gallium zinc oxide (IGZO), indium zinc oxide (IZO), indium gallium oxide, other applicable materials, or a combination thereof. The oxide semiconductor material layer may be formed by any suitable patterning method. For example, the oxide semiconductor material layer is patterned using photolithography process. In some embodiments, as illustrated in FIG. 14, the semiconductor channel layers CH2 are formed above the bottom gates G1 and the middles gates G2, and the semiconductor channel layers CH2 are spaced apart from the middle gates G2 by the gate insulating layer GI3. In some embodiments, as illustrated in FIG. 14, the configuration (e.g., channel length, channel width, thickness, and so on) of the semiconductor channel layers CH2 is the same as the configuration of the semiconductor channel layers CH1.

A dielectric layer D4 having openings OP3 formed therein is formed over the gate insulating layer GI3. The openings OP3 formed in the dielectric layer D4 define dimension (e.g., width, length and thickness) and distribution of the subsequently formed source electrodes SE2 and drain electrodes DE2. The semiconductor channel layers CH2 are located in the openings OP3 of the dielectric layer D4. The dielectric layer D4 may be deposited over the gate insulating layer GI3 and the semiconductor channel layers CH2 using a CVD process, an ALD process, a FCVD process, a PVD process, one or more other applicable processes, or a combination thereof. The dielectric layer D4 may be made of or include silicon oxide, silicon oxynitride, BSG, PSG, BPSG, FSG, low-k material, porous dielectric material, one or more other suitable materials, or a combination thereof. The openings OP3 of the dielectric layer D4 may be formed by any suitable patterning method. For example, the dielectric layer D4 is patterned using photolithography process. In some embodiments, as illustrated in FIG. 14, the openings OP3 formed in the dielectric layer D4 have a depth substantially equal to the thickness of the dielectric layer D4 such that the semiconductor channel layers CH2 and portions of the gate insulating layer GI3 are revealed by the openings OP3.

Referring to FIG. 14, after patterning the dielectric layer D4, source electrodes SE2 and drain electrodes DE2 of driving transistors (e.g., thin film transistors) are formed on the gate insulating layer GI3 and fill in the openings OP3 of dielectric layer D4. A conductive material (e.g., copper or other suitable metallic materials) may be deposited over the dielectric layer D4 and fill into the openings OP3 defined in the dielectric layer D4. The conductive material may be deposited using a CVD process or other applicable processes. In some embodiments, the conductive material for forming the source electrodes SE2 and the drain electrodes DE2 includes a single metal layer. In some alternative embodiments, the conductive material for forming the source electrodes SE2 and the drain electrodes DE2 includes laminated metal layers. A planarization process may be performed to remove the deposited conductive material until the top surface of the dielectric layer D4 is revealed such that the source electrodes SE2 and the drain electrodes DE2 are formed in the openings OP3. The planarization process may include a chemical mechanical polishing (CMP) process, a grinding process, an etching process, a dry polishing process, one or more other applicable processes, or a combination thereof. In some embodiments, as illustrated in FIG. 14, the top surfaces of the source electrodes SE2 and drain electrodes DE2 are substantially leveled with the top surface of the dielectric layer D4. In some alternative embodiments, not illustrated in figures, a level height difference due to grinding selectivity or etching selectivity is between the top surfaces of the source electrodes SE2 and the drain electrodes DE2 and the top surface of the dielectric layer D4.

The source electrodes SE2 and drain electrodes DE2 are disposed at two opposite sides of the respective semiconductor channel layers CH2. The source electrodes SE2 and drain electrodes DE2 are in contact with sidewalls of the respective semiconductor channel layers CH2. In some embodiments, as illustrated in FIG. 14, the thickness of the source electrodes SE2 and drain electrodes DE2 is substantially equal to the thickness of the semiconductor channel layers CH2. In some embodiments, not illustrated in figures, a level height difference due to grinding selectivity or etching selectivity is between the top surfaces of the source electrodes SE2 and the drain electrodes DE2 and the top surfaces of the semiconductor channel layers CH2. Further, as illustrated in FIG. 14, the configuration (e.g., channel length, channel width, thickness, and so on) of the source electrodes SE2 and the drain electrodes DE2 may be the same as the configuration of the source electrodes SE1 and the drain electrodes DE1.

In some embodiments, as illustrated in FIG. 14, the top surfaces of the semiconductor channel layers CH2 are substantially leveled with the top surface of the dielectric layer D4. In some alternative embodiments, not illustrated in figures, a level height difference due to grinding selectivity or etching selectivity is between the top surfaces of the semiconductor channel layers CH2 and the top surface of the dielectric layer D4.

Figure 15:
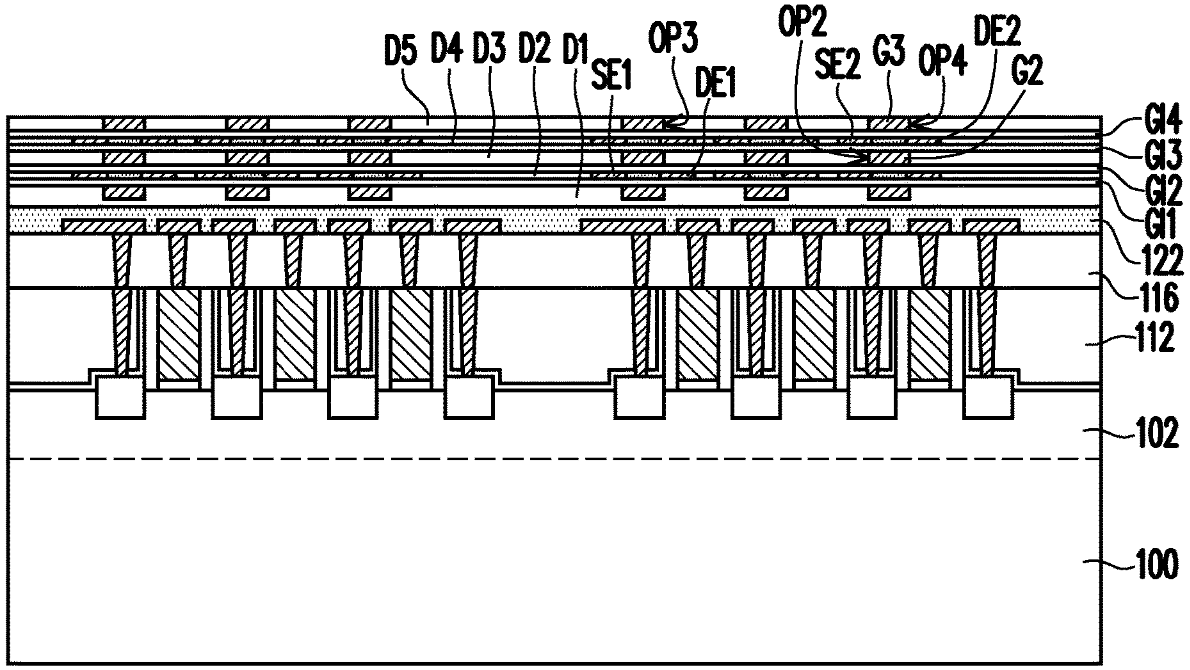

Referring to FIG. 15, a gate insulating layer GI4 is formed to cover the semiconductor channel layers CH2, the source electrodes SE2, the drain electrodes DE2, and the dielectric layer D3. The gate insulating layer GI4 may be deposited over the dielectric layer D4 using a CVD process, an ALD process, a FCVD process, a PVD process, one or more other applicable processes, or a combination thereof. The gate insulating layer GI4 may be made of or include silicon oxide, silicon oxynitride, aluminum oxide ($Al_2O_3$), BSG, PSG, BPSG, FSG, low-k material, high-k material, porous dielectric material, one or more other suitable materials, or a combination thereof. In some embodiments, the gate insulating layer GI4 includes a single insulating layer. In some alternative embodiments, the gate insulating layer GI4 includes laminated insulating layers.

A dielectric layer D5 having openings OP4 formed therein is formed over the gate insulating layer GI4. The openings OP4 formed in the dielectric layer D5 define dimension (e.g., width, length and thickness) and distribution of the subsequently formed top gates G3. The dielectric layer D5 may be deposited over the gate insulating layer GI4 using a CVD process, an ALD process, a FCVD process, a PVD process, one or more other applicable processes, or a combination thereof. The dielectric layer D5 may be made of or include silicon oxide, silicon oxynitride, BSG, PSG, BPSG, FSG, low-k material, porous dielectric material, one or more other suitable materials, or a combination thereof. The openings OP4 of the dielectric layer D5 may be formed by any suitable patterning method. For example, the dielectric layer D5 is patterned using photolithography process. In some embodiments, as illustrated in FIG. 15, the openings OP4 formed in the dielectric layer D5 have a depth substantially equal to the thickness of the dielectric layer D5 such that the gate insulating layer GI4 is revealed by the openings OP4.

After patterning the dielectric layer D5, top gates G3 of driving transistors (e.g., thin film transistors) are formed on the dielectric layer D5. A conductive material (e.g., copper or other suitable metallic materials) may be deposited over the dielectric layer D5 and fill into the openings OP4 defined in the dielectric layer D5. The conductive material may be deposited using a CVD process or other applicable processes. In some embodiments, the conductive material for forming the top gates G3 includes a single metal layer. In some alternative embodiments, the conductive material for forming the top gates G3 includes laminated metal layers. A planarization process may be performed to remove the deposited conductive material until the top surface of the dielectric layer D5 is revealed such that the top gates G3 are formed in the openings OP4. The top surfaces of the top gates G3 may be flat surfaces. In some alternative embodiments, the top surfaces of the top gates G3 are concave surfaces or convex surfaces. The planarization process may include a chemical mechanical polishing (CMP) process, a grinding process, an etching process, a dry polishing process, one or more other applicable processes, or a combination thereof. In some embodiments, as illustrated in FIG. 15, the top surfaces of the top gates G3 are substantially leveled with the top surface of the dielectric layer D5. In some alternative embodiments, not illustrated in figures, a level height difference due to grinding selectivity or etching selectivity is between the top surfaces of the top gates G3 and the top surface of the dielectric layer D5.

In some embodiments, the top gates G3 are portions of word lines; in other words, the portions of word lines may provide function of the top gates G3. In some alternative embodiments, the top gates G3 are not portions of word lines, the top gates G3 are separated from one another, and the top gates G3 are electrically connected to the word lines by conductive vias. The top gates G3 are classified into groups, and each group of the top gates G3 are electrically connected to one of the word lines respectively. In some embodiments, the bottom gate G1, the middle gate G2 and the top gate G3 of a single transistor TR are electrically connected to each other through a contact via. The contact via does not overlap the semiconductor channel layers CH1, CH2 and CH3. The contact via may penetrate through the top gate G3 and the middle gate G2, and the contact via may land on the bottom gate G1. In some alternative embodiments, routings of a staircase structure are implemented to electrically connect the bottom gate G1, the middle gate G2 and the top gate G3 of a single transistor TR.

In some embodiments, after forming the bottom gates G1, the middle gates G2 and the top gates G3, the process steps illustrated in FIG. 12 and FIG. 13 may be repeated at least one more time to form additional gates, gate insulating layer, source electrodes, drain electrodes and semiconductor channel layers over the top gates G3.

Figure 16:
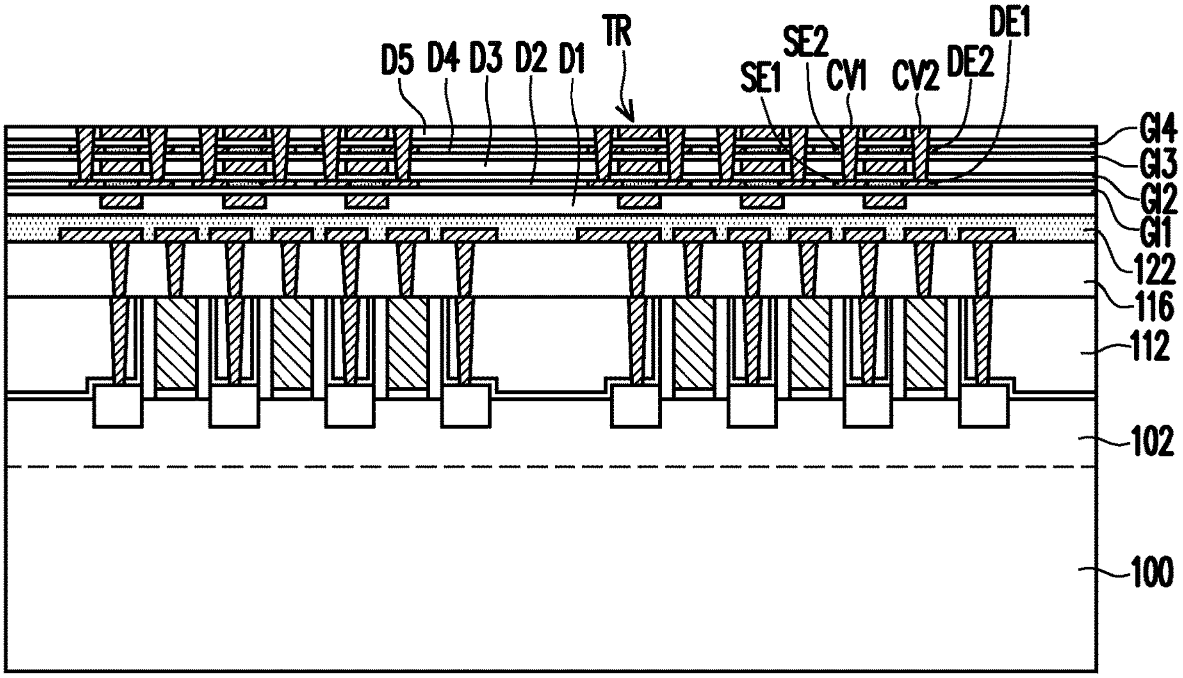

Referring to FIG. 16, contact vias CV1 and contact vias CV2 are formed. The contact vias CV1 are electrically connected to the source electrodes SE1 and source electrodes SE2, and the contact vias CV2 are electrically connected to the drain electrodes DE1 and drain electrodes DE2. The contact vias CV1 may penetrate through the source electrodes SE2 and land on the source electrodes SE1. The contact vias CV2 may penetrate through the drain electrodes DE2 and land on the drain electrodes DE1. As illustrated in FIG. 16, the contact vias CV1 penetrate through the dielectric layer D5, the gate insulating layer GI4, the dielectric layer D4, the source electrodes SE2, the gate insulating layer GI3, the dielectric layer D3 and the gate insulating layer GI2 such that the contact vias CV1 can land on the source electrodes SE1. Further, the contact vias CV2 penetrate through the dielectric layer D5, the gate insulating layer GI4, the dielectric layer D4, the drain electrodes DE2, the gate insulating layer GI3, the dielectric layer D3 and the gate insulating layer GI2 such that the contact vias CV1 can land on the drain electrodes DE1. The dielectric layer D5, the gate insulating layer GI4, the dielectric layer D4, the drain electrodes DE2, the gate insulating layer GI3, the dielectric layer D3 and the gate insulating layer GI2 are patterned to form via holes. The dielectric layer D5, the gate insulating layer GI4, the dielectric layer D4, the drain electrodes DE2, the gate insulating layer GI3, the dielectric layer D3 and the gate insulating layer GI2 may be patterned by any suitable method. For example, the dielectric layer D5, the gate insulating layer GI4, the dielectric layer D4, the drain electrodes DE2, the gate insulating layer GI3, the dielectric layer D3 and the gate insulating layer GI2 are patterned using photolithography process. After patterning the dielectric layer D5, the gate insulating layer GI4, the dielectric layer D4, the drain electrodes DE2, the gate insulating layer GI3, the dielectric layer D3 and the gate insulating layer GI2, via holes which expose the source electrode SE1 and the drain electrodes DE are formed. A conductive material (e.g., copper or other suitable metallic materials) may be deposited over the dielectric layer D5 and fill into the via holes. The conductive material may be deposited using a CVD process or other applicable processes. In some embodiments, a planarization process is performed to remove the deposited conductive material until the top surface of the dielectric layer D5 is revealed. The planarization process may include a chemical mechanical polishing (CMP) process, a grinding process, an etching process, a dry polishing process, one or more other applicable processes, or a combination thereof. As shown in FIG. 16, after performing the planarization process, the contact vias CV1 and CV2 are formed. The contact vias CV1 and CV2 serve as source/drain contacts.

As illustrated in FIG. 16, driving transistors TR each having multiple gates G1, G2 and G3 are formed. The driving transistors TR may have great performance in driving current ($I_{on}$). Each of the driving transistors TR may respectively include a first gate G1, a second gate G2 disposed above the first gate G1, a first channel layer CH1 disposed between the first gate G1 and the second gate G2, a first source electrode SE1 and a first drain electrode DE1 disposed at opposite sides of the first channel layer CH1, a third gate G3 disposed above the second gate G2, a second channel layer CH2 disposed between the second gate G2 and the third gate G3, a second source electrode SE2 and a second drain electrode DE2 disposed at opposite sides of the second channel layer CH2. The third gate G is electrically connected to the first gate G1 and the second gate G2. The first source electrode SE1 is electrically connected to the second source electrode SE2 by the contact vias CV1, and the first drain electrode DE1 is electrically connected to the second drain electrode DE2 by the contact vias CV2.

Figure 17:
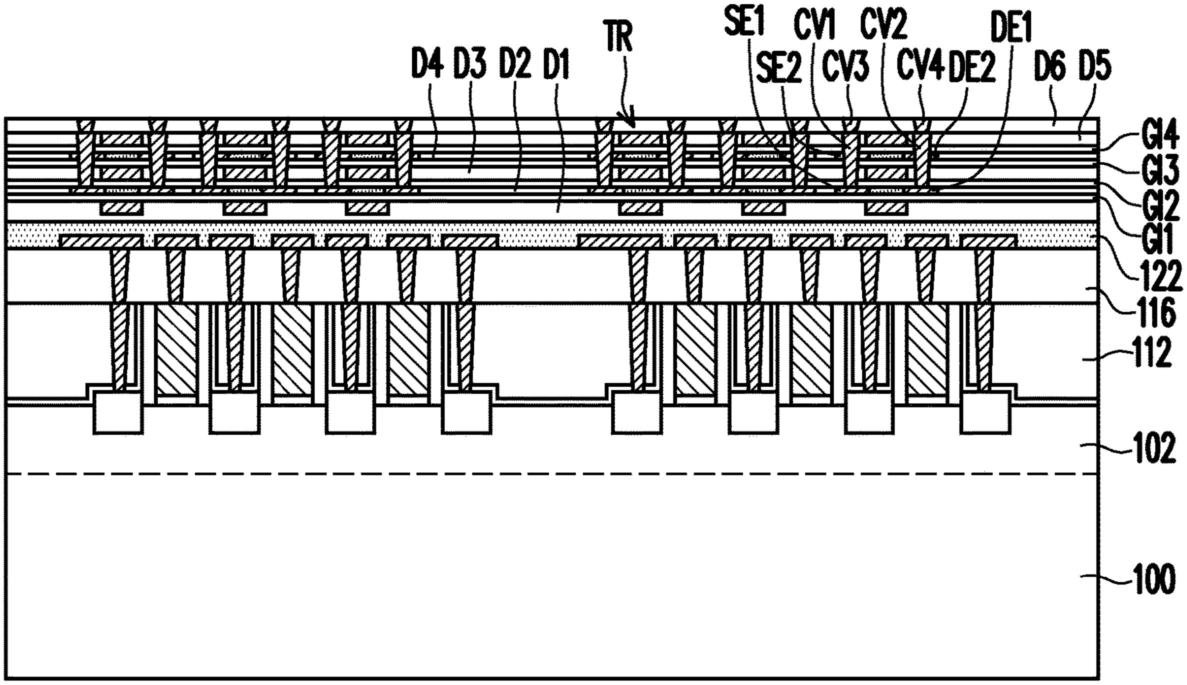

Referring to FIG. 17, a dielectric layer D6 having contact vias CV3 and contact vias CV4 embedded therein is formed over the dielectric layer D5. The dielectric layer D6 may be deposited over the dielectric layer D5 using a CVD process, an ALD process, a FCVD process, a PVD process, one or more other applicable processes, or a combination thereof. The dielectric layer D65 may be made of or include silicon oxide, silicon oxynitride, BSG, PSG, BPSG, FSG, low-k material, porous dielectric material, one or more other suitable materials, or a combination thereof. The via holes in the dielectric layer D6 may be formed by any suitable patterning method. For example, the dielectric layer D6 is patterned using photolithography process. In some embodiments, as illustrated in FIG. 17, the via holes formed in the dielectric layer D6 have a depth substantially equal to the thickness of the dielectric layer D6 such that the contact vias CV1 and the contact vias CV2 are revealed by the via holes. A conductive material (e.g., copper or other suitable metallic materials) may be deposited over the dielectric layer D5 and fill into the via holes. The conductive material may be deposited using a CVD process or other applicable processes. In some embodiments, a planarization process is performed to remove the deposited conductive material until the top surface of the dielectric layer D5 is revealed. The planarization process may include a chemical mechanical polishing (CMP) process, a grinding process, an etching process, a dry polishing process, one or more other applicable processes, or a combination thereof. As shown in FIG. 17, after performing the planarization process, the contact vias CV3 and CV4 are formed, the contact vias CV3 are electrically connected to and land on the contact vias CV1, and the contact vias CV4 are electrically connected to and land on the contact vias CV2.

The first channel layers CH1, the first source electrodes SE1 and the first drain electrodes DE1 may be located at a first level height while the second channel layers CH2, the second sources electrodes SE2 and the second drain electrodes DE2 are located at a second level height higher than the first level height. In some embodiments, the first gates G1 may be located at a level height lower than the first level height, the second gates G2 is located at a level height higher than the first level height and lower than the second level height, and the third gates G3 is located at a level height higher than the second level height. In some embodiments, the transistors TR further includes a first gate insulating layer GI1 disposed between the first gates G1 and the first channel layers CH1, and the first gates G1 is spaced apart from the first source electrodes SE1 and the first drain electrodes DE1 by the first gate insulating layer GI1. In some embodiments, the transistors TR further includes a second gate insulating layer GI2 disposed between the second gates G2 and the first channel layers CH1, and the second gates G2 are spaced apart from the first source electrodes SE and the first drain electrodes DE by the second gate insulating layer GI2. In some embodiments, the transistors TR further includes a third gate insulating layer GI3 disposed between the second gates G2 and the second channel layers CH2, and the second gates G2 are spaced apart from the second source electrodes SE2 and the second drain electrodes DE2 by the third gate insulating layer GI3. In some embodiments, the transistors TR further includes a fourth gate insulating layer GI4 disposed between the third gates G3 and the second channel layers CH2, and the third gates G3 are spaced apart from the second source electrode SE2 and the second drain electrodes DE2 by the fourth gate insulating layer GI4. In some embodiments, the first source electrodes SE1 are electrically connected to the second source electrodes SE2 through first contact vias CV1, and the first drain electrodes DE1 are electrically connected to the second drain electrode DE2 through second contact vias CV2, the first contact vias CV1 penetrate through the second source electrodes SE2 and lands on the first source electrodes SE1, and the second contact vias CV2 penetrate through the second drain electrodes DE2 and lands on the first drain electrodes DE1.

Figure 18:
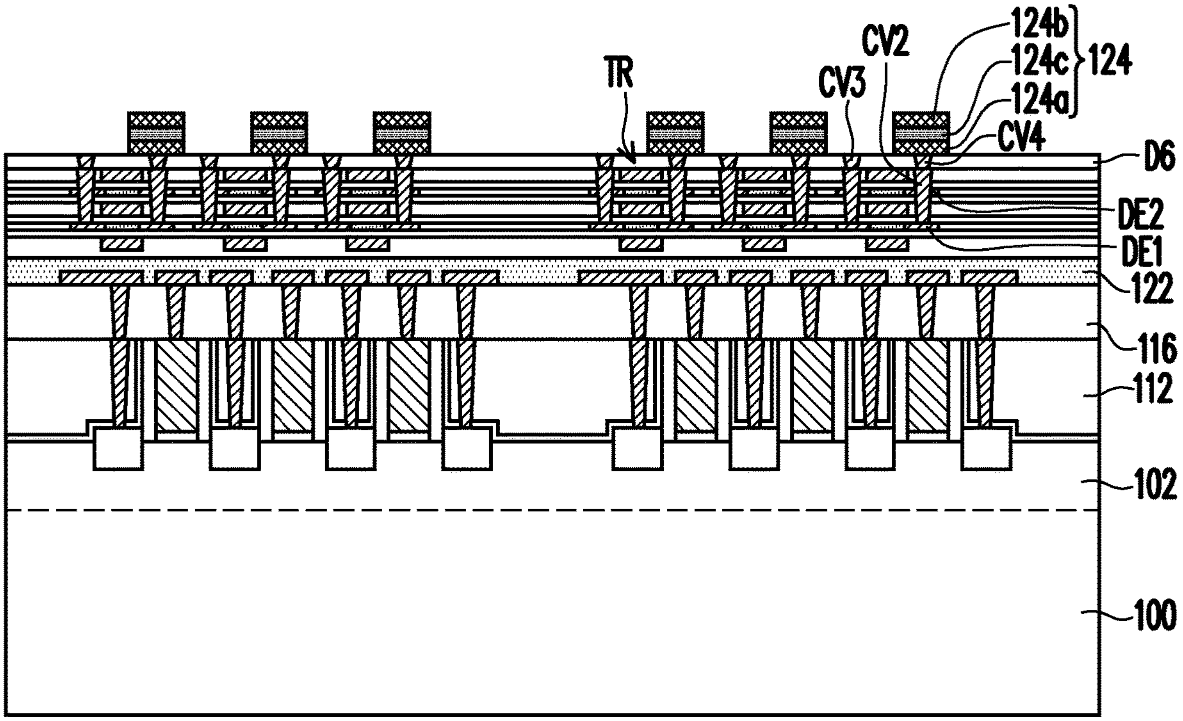

Referring to FIG. 18, memory cells 124 are formed over the dielectric layer D6. In some embodiments, the memory cells 124 are MRAM cells. MRAM cell is a form of data storage element for integrated circuits. In comparison with other devices, MRAM cell uses small amounts of power to read and write data. MRAM also has long data retention times in comparison with other devices. In some embodiments, MRAM cells have multi-year data retention times, while the power consumption for reading and writing data is similar to single read or write operations for dynamic random access memory (DRAM) cells. However, in contrast to DRAM cells, MRAM cells are able to store data without regular refreshing of cells in order to preserve stored data. MRAM cells include magnetic tunnel junctions (MTJs) that enable the use of tunneling magnetoresistance (TMR) to determine the information state of an MRAM cell. A magnetic tunnel junction includes a stack of at least three layers, including a dielectric tunneling barrier layer 124*c* and two ferromagnetic layers 124*a* and 124*b* separated by the dielectric tunneling barrier layer. The two ferromagnetic layers includes a reference layer 124*a* (also called a magnetic pinned layer) and a free layer 124*b* (also called a magnetic storage layer). The reference layer 124*a* has a layer of magnetizable material with a locked magnetic field orientation, and the free layer 124*b* has a layer of magnetizable material where the magnetic field orientation changes between different orientations. Further, the reference layer 124*a* of the memory devices 124 are electrically connected to the first drain electrodes DE1 and the second drain electrodes DE2 of the driving transistors TR through the contact vias CV2 and CV4.

When the magnetic field of the reference layer 124*a* and the free layer 124*b* are aligned having the same orientation, the MRAM cell allows a large amount of current to flow in comparison to the allowed amount of current flowing through the MRAM cell when the magnetic field of the reference layer 124*a* and the magnetic field of the free layer 124*b* have opposite orientations. The different amounts of current are associated with different information states (e.g., a high amount of current is associated with a "1" bit, and a low amount of current is associated a "0" bit, or vice versa) of the MRAM cell.

MRAM cells are of increasing interest in integrated circuit and semiconductor manufacturing because the magnetic fields of MRAM cells are able to provide long-term data storage. In some embodiments, the magnetization of the reference layer and/or the free layer of an MTJ in an MRAM cell retain the magnetic field orientations associated with a stored bit of information for up to several years, or longer, before thermally-induced field flipping occurs. The read time and the write time of MRAM cells are fast (on the order of DRAM cell reading speed), but the data retention time is at orders of magnitude longer than data retention time of DRAM cells without refreshing.

A stored bit of information may be written into the free layer 124*b* by applying charge current passing through an MTJ of an MRAM cell. The applied charge current passing through the reference layer 124*a* becomes spin polarized and exerts a torque on the free layer. The direction of the applied charge current and magnetization of the reference layer 124*a* determines the direction of generated torque. A large enough torque can switch the magnetic field of the free layer 124*b*. When performing a "write" procedure of the MRAM cell, a bidirectional charge current is required to determine the information state (i.e. magnetic field) of the free layer 124*b* such that a "0" bit or a "1" bit may be stored in the MTJ of the MRAM cell.

Although MRAM cells are described in accompany with FIG. 18, other applicable memory devices may be utilized as well.

Since the memory cells 124 are formed through manufacturing processes of back end of line (BEOL), it is easy to form the memory cells 124 having high density in an interconnect structure of a semiconductor die.

Figure 19:
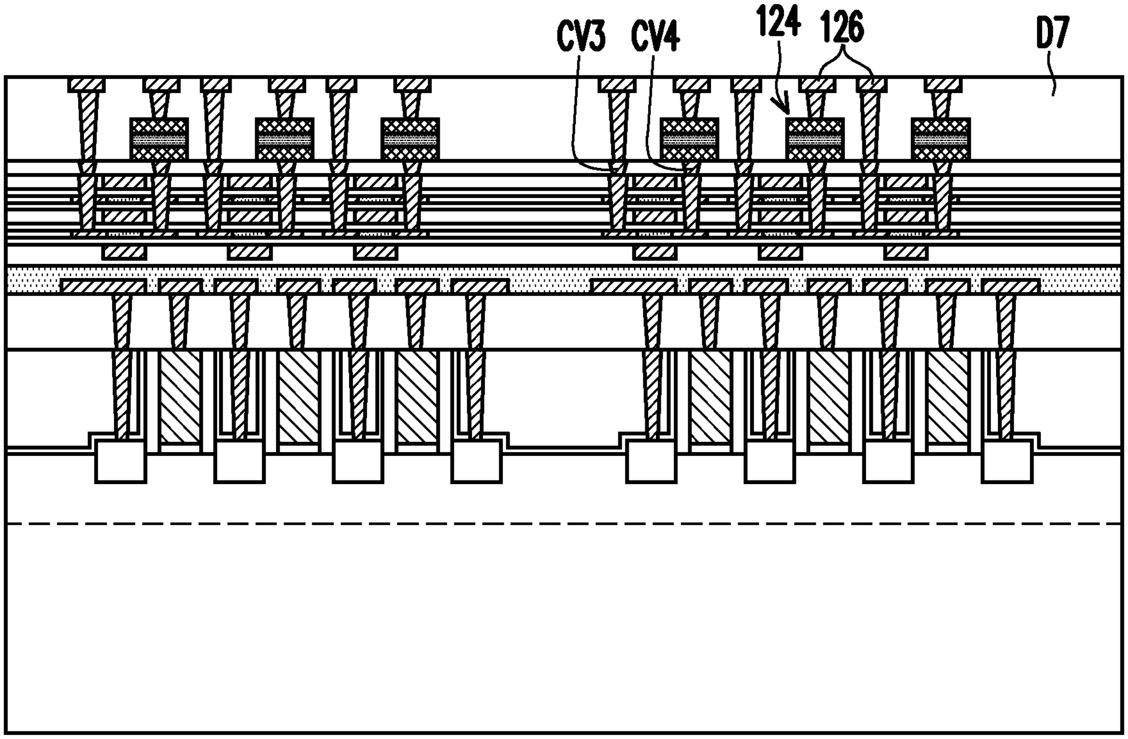

Referring to FIG. 19, a dielectric layer D7 is formed over the dielectric layer D6. A dielectric material layer may be deposited over the dielectric layer D6 using a CVD process, an ALD process, a FCVD process, a PVD process, one or more other applicable processes, or a combination thereof. The dielectric material layer may be made of or include silicon oxide, silicon oxynitride, BSG, PSG, BPSG, FSG, low-k material, porous dielectric material, one or more other suitable materials, or a combination thereof. The dielectric material layer and may be patterned by any suitable method. For example, the dielectric material layer is patterned using a photolithography process. During the patterning process of the dielectric material layer, via holes are formed in the dielectric layer D7 for exposing the contact vias CV3 and the memory cells 124. After forming the dielectric layer D7, a conductive material (e.g., copper or other suitable metallic materials) may be deposited over the dielectric layer D7 to fill the via holes. A removal process is then performed to remove portions the conductive material until the top surface of the dielectric layer D7 is revealed such that interconnect wirings 126 are formed in the damascene openings. The removal process may include a chemical mechanical polishing (CMP) process, a grinding process, an etching process, a dry polishing process, one or more other applicable processes, or a combination thereof.

After forming the interconnect wirings 126, fabrication of a memory cell array including driving transistors TR and memory cells 124 embedded in the dielectric layer D7 is accomplished.

Figure 20:
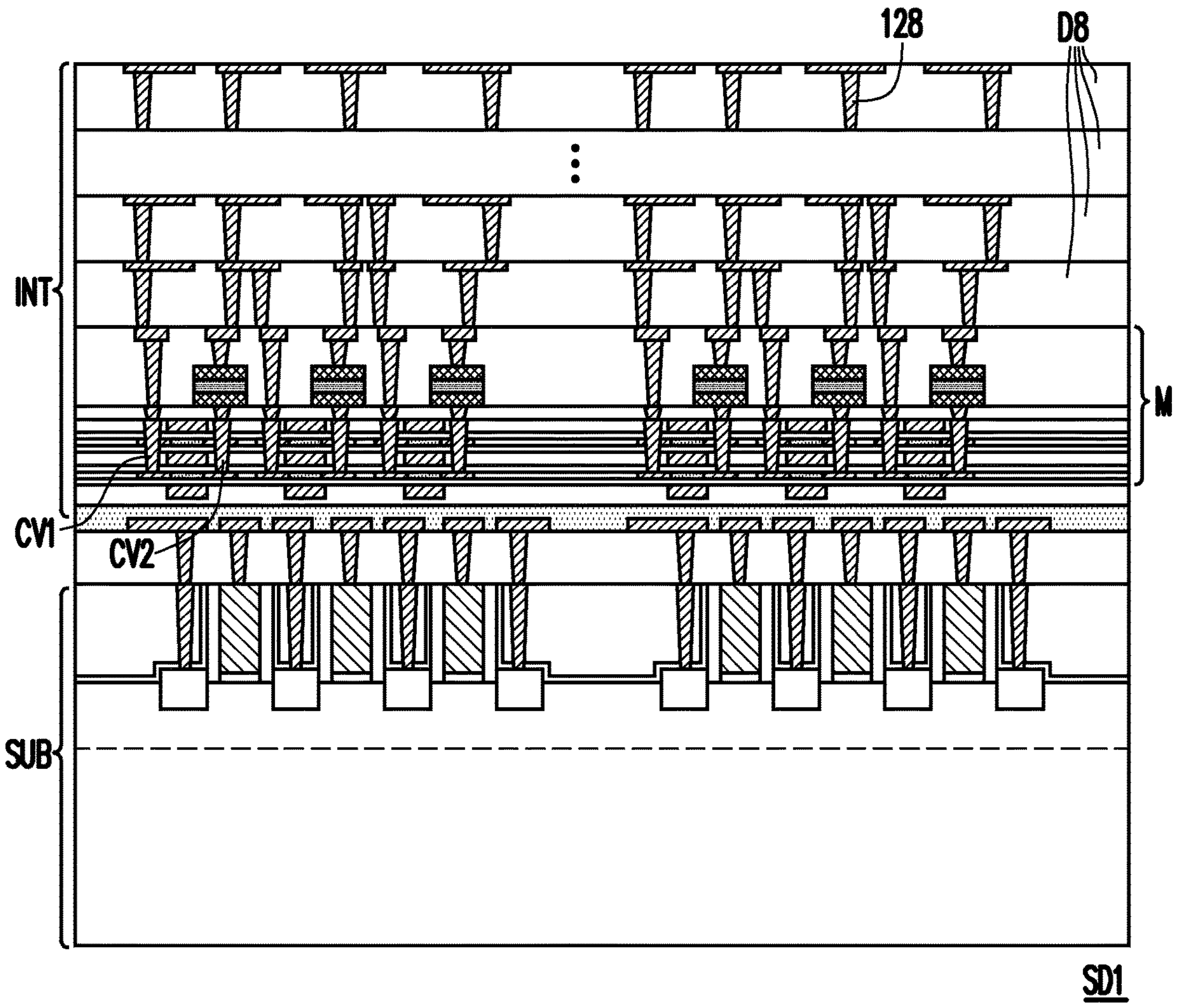

Referring to FIG. 20, dielectric layers D8 and interconnect wirings 128 are alternately formed over the dielectric layer D7. The interconnect wirings 128 are embedded in the dielectric layers D8 and electrically connected to the memory cells 124 and/or the driving transistors TR. The fabrication of the dielectric layers D8 and interconnect wirings 128 may be similar to that of the dielectric layer D7 and interconnect wirings 126. Detailed descriptions relate to the fabrication of the dielectric layers D8 and interconnect wirings 128 are thus omitted.

Figure 21:
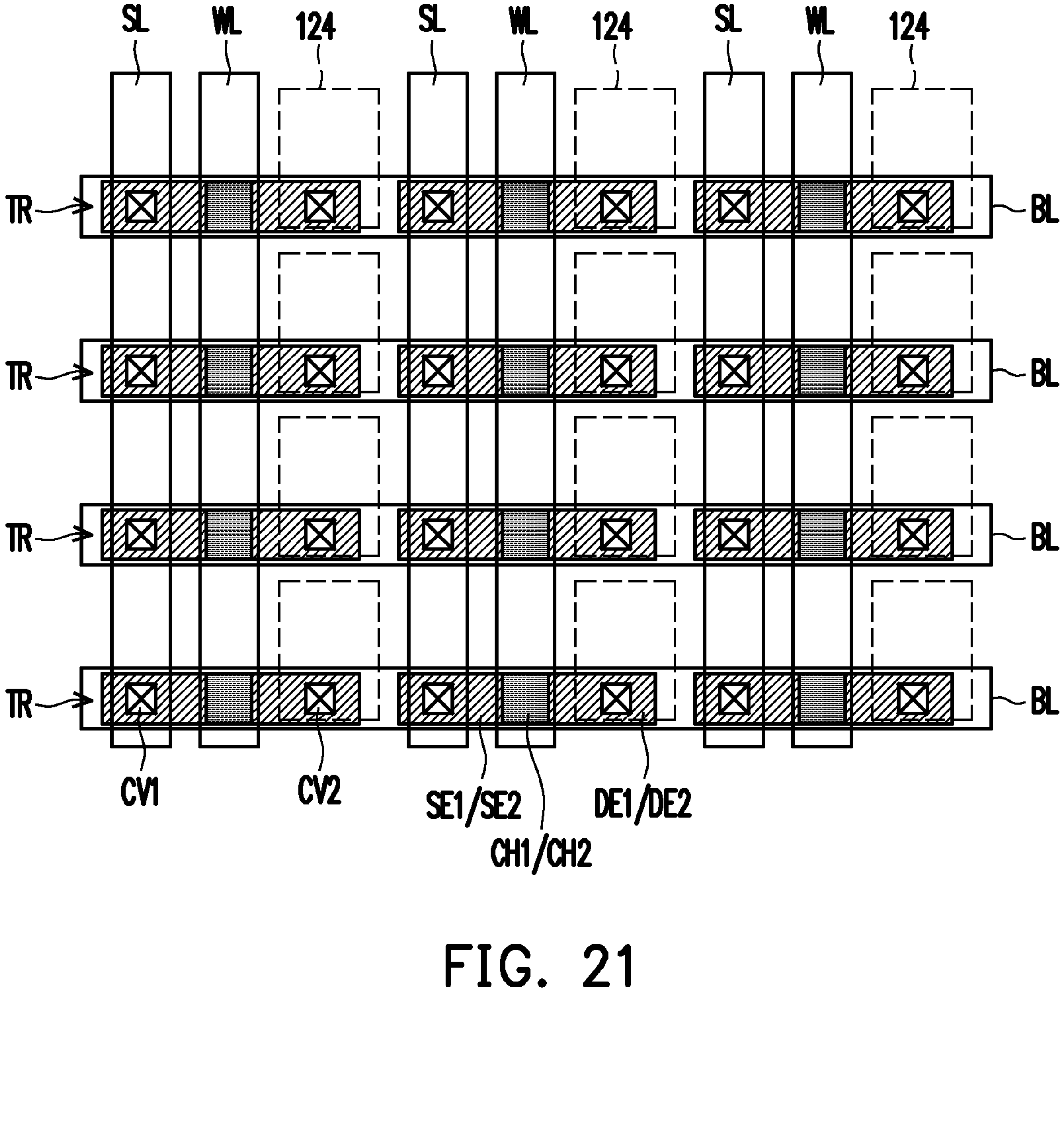
FIG. 21 is a top view of the semiconductor device illustrated in FIG. 20.

FIG. 21 is a top view of the semiconductor die illustrated in FIG. 20. Referring to FIG. 20 and FIG. 21, a semiconductor die SD1 may include a semiconductor substrate SUB and an interconnect structure INT disposed over the semiconductor substrate SUB. The semiconductor substrate SUB may include a logic circuit formed therein, and the logic circuit may include transistors (e.g., FinFET, MOSFET or other applicable FEOL transistors). The interconnect structure INT includes an embedded memory cell array M, the embedded memory cell array M includes word lines WL, bit lines BL, source lines SL, and memory devices, each of the memory devices includes a driving transistor TR and a memory cell 124 electrically connected to the driving transistor TR. Detailed descriptions relate to the fabrication and configuration of the driving transistors TR are described in accompany with FIG. 16. In some embodiments, the word lines WL are paralleled with one another and extend along a first direction, the source lines SL are paralleled with one another and extend along the first direction, and the bit lines BL are paralleled with one another and extend along a second direction different from the first direction. For example, the first direction is perpendicular to the second direction.

Figure 22:
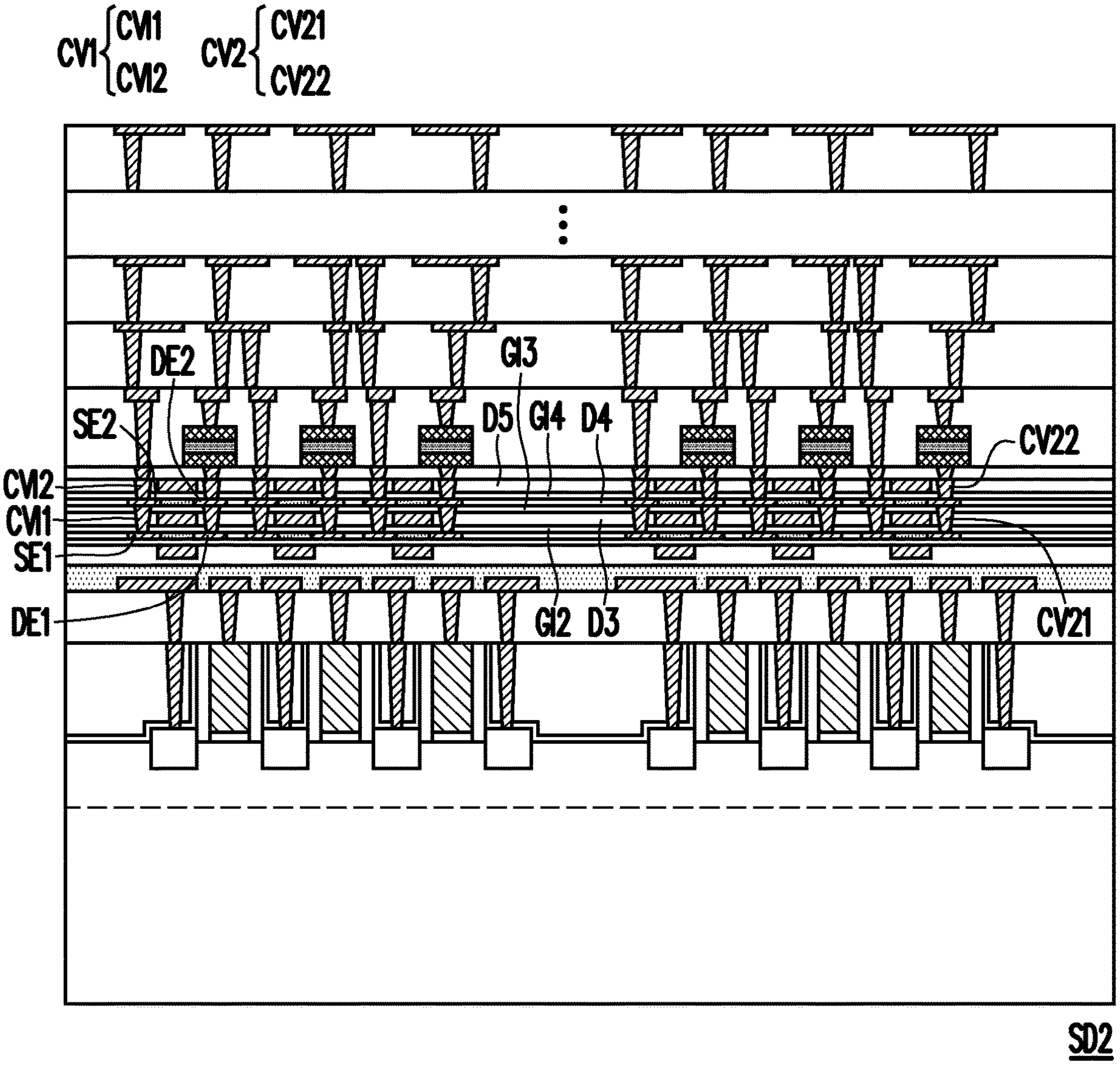
FIG. 22 through FIG. 24 are cross-sectionals view schematically illustrating various semiconductor devices in accordance with various embodiments of the present disclosure.
Figure 23:
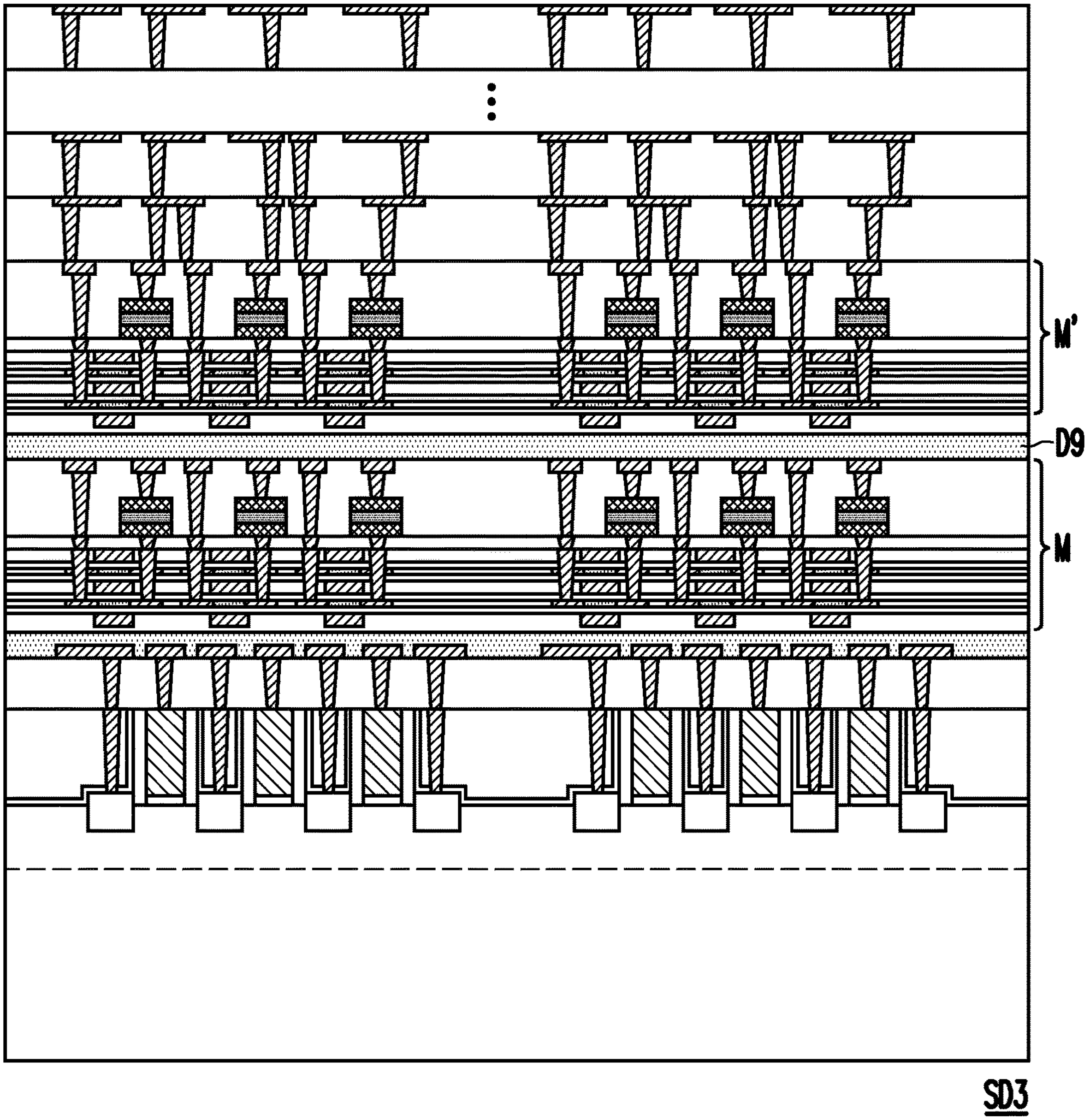
Figure 24:
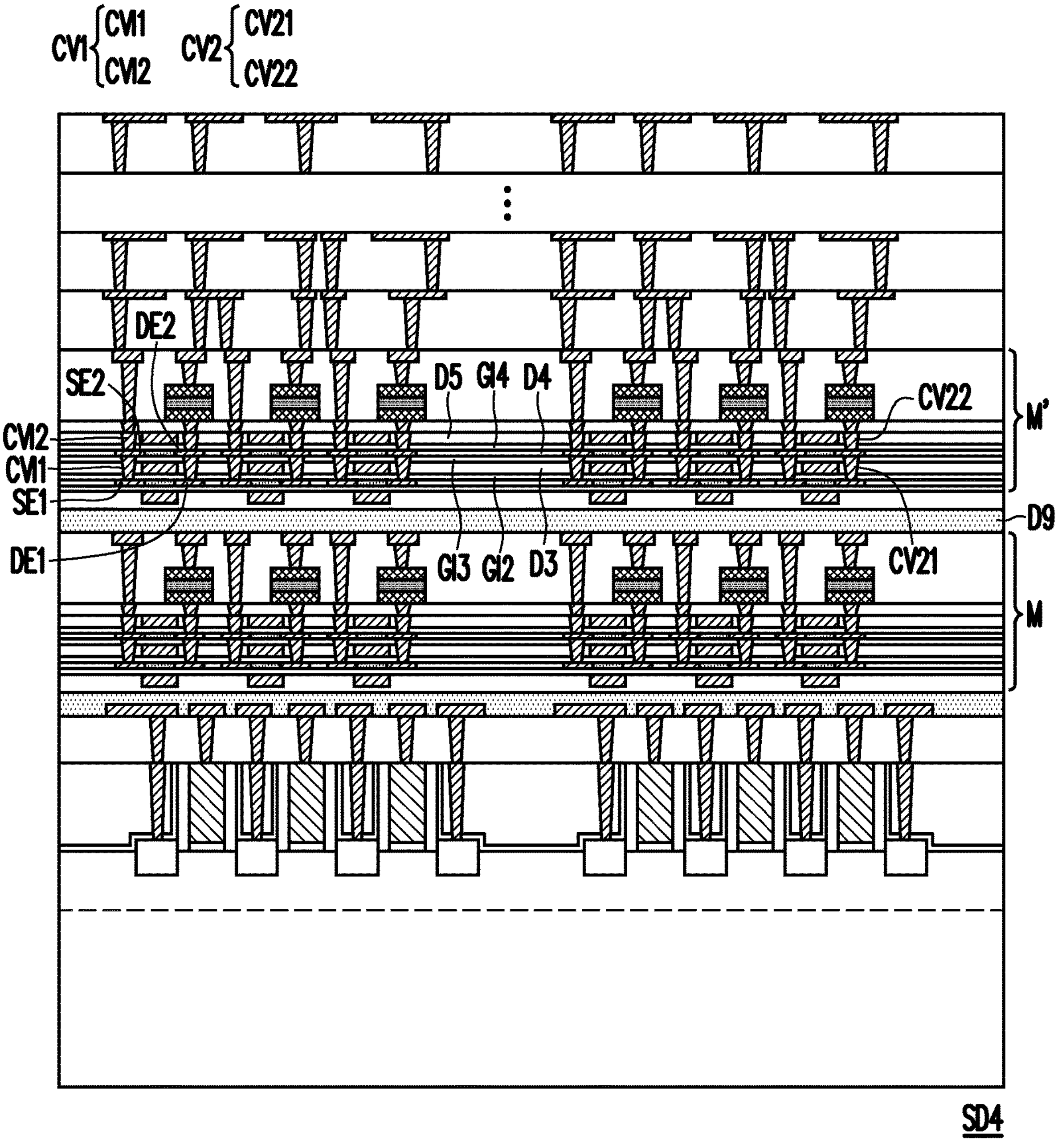

FIG. 22 through FIG. 24 are cross-sectionals view schematically illustrating various semiconductor dies in accordance with various embodiments of the present disclosure.

Referring to FIG. 21 and FIG. 22, a semiconductor die SD2 illustrated in FIG. 22 is similar to the semiconductor die SD1 except that each of the contact vias CV1 includes a conductive vias CV11 and a conductive via CV12 stacked over the conductive via CV11, and each of the contact vias CV2 includes a conductive vias CV21 and a conductive via CV22 stacked over the conductive via CV21. As illustrated in FIG. 22, the conductive vias CV11 and CV21 are embedded in the gate insulating layer GI2 and the dielectric layer D3, the conductive vias CV12 and CV22 are embedded in the dielectric layer D4, the gate insulating layer GI and the dielectric layer D5. Further, the conductive vias CV11 may land on the first source electrodes SE1, the conductive vias CV 21 may land on the first drain electrode DE1, the conductive vias CV21 may land on the second source electrodes SE2, and the conductive vias CV 22 may land on the second drain electrode DE2.

Referring to FIG. 21 and FIG. 23, the semiconductor die SD3 illustrated in FIG. 23 is similar to the semiconductor die SD1 illustrated in FIG. 21 except that the semiconductor die SD3 further includes a dielectric layer D9 and a memory cell array M', the dielectric layer D9 is disposed over the memory cell array M, and the memory cell array M' is disposed on the dielectric layer D9. Accordingly, the semiconductor die SD3 is advantage in high memory density. Although two layers of stacked memory cell arrays M and M' are formed in the semiconductor die SD3 for illustration, the number of the stacked memory cell arrays M may be modified according to design requirements. In some alternative embodiments, not illustrated in figures, more than two stacked memory cell arrays are formed in a semiconductor die.

Referring to FIG. 22 and FIG. 24, the semiconductor die SD4 illustrated in FIG. 24 is similar to the semiconductor die SD2 illustrated in FIG. 22 except that the semiconductor die SD4 further includes a dielectric layer D9 and a memory cell array M', the dielectric layer D9 is disposed over the memory cell array M, and the memory cell array M' is disposed on the dielectric layer D9. Accordingly, the semiconductor die SD3 is advantage in high memory density. Although two layers of stacked memory cell arrays M and M' are formed in the semiconductor die SD3 for illustration, the number of the stacked memory cell arrays M may be modified according to design requirements. In some alternative embodiments, not illustrated in figures, more than two stacked memory cell arrays are formed in a semiconductor die.

As illustrated in FIG. 24, each of the contact vias CV1 in the memory cell array M includes a conductive vias CV11 and a conductive via CV12 stacked over the conductive via CV11, and each of the contact vias CV2 memory cell array M includes a conductive vias CV21 and a conductive via CV22 stacked over the conductive via CV21. Further, each of the contact vias CV1 in the memory cell array M' includes a conductive vias CV11 and a conductive via CV12 stacked over the conductive via CV11, and each of the contact vias CV2 memory cell array M' includes a conductive vias CV21 and a conductive via CV22 stacked over the conductive via CV21.

In the above-described embodiments, the driving transistors TR include multiple stacked gates (e.g., triple gates) and multiple channel layers (e.g., dual channels) between the stacked gates, accordingly, driving current controlled by the driving transistors TR may increase significantly, and performance of the memory devices is enhanced.

An embodiment of the present invention relates to a memory device including a transistor and a memory cell. The transistor includes a first gate, a second gate disposed above the first gate, a first channel layer disposed between the first gate and the second gate, a first source electrode and a first drain electrode disposed at opposite sides of the first channel layer, a third gate disposed above the second gate, a second channel layer disposed between the second gate and the third gate, a second source and a second drain electrode disposed at opposite sides of the second channel layer. The third gate is electrically connected to the first gate and the second gate. The first source electrode is electrically connected to the second source, and the first drain electrode is electrically connected to the second drain electrode. The memory cell is electrically connected to the first drain electrode and second drain electrode. In some embodiments, the first channel layer, the first source electrode and the first drain electrode are located at a first level height while the second channel layer, the second source electrode and the second drain electrode are located at a second level height higher than the first level height. In some embodiments, the first gate is located at a level height lower than the first level height, the second gate is located at a level height higher than the first level height and lower than the second level height, and the third gate is located at a level height higher than the second level height. In some embodiments, the transistor further includes a first gate insulating layer disposed between the first gate and the first channel layer, and the first gate is spaced apart from the first source electrode and the first drain electrode by the first gate insulating layer. In some embodiments, the transistor further includes a second gate insulating layer disposed between the second gate and the first channel layer, and the second gate is spaced apart from the first source electrode and the first drain electrode by the second gate insulating layer. In some embodiments, the transistor further includes a third gate insulating layer disposed between the second gate and the second channel layer, and the second gate is spaced apart from the second source and the second drain electrode by the third gate insulating layer. In some embodiments, the transistor further includes a fourth gate insulating layer disposed between the third gate and the second channel layer, and the third gate is spaced apart from the second source and the second drain electrode by the fourth gate insulating layer. In some embodiments, the first source electrode is electrically connected to the second source through a first via, and the first drain electrode is electrically connected to the second drain electrode through a second via, the first via penetrates through the second source and lands on the first source electrode, and the second via penetrates through the second drain electrode and lands on the first drain electrode.

Another embodiment of the present invention relates to a semiconductor die including a semiconductor substrate and an interconnect structure disposed over the semiconductor substrate. The interconnect structure includes an embedded memory cell array, the embedded memory cell array includes word lines, bit lines, source lines, and memory devices, at least one of the memory devices includes a transistor and a memory cell electrically connected to the transistor. At least one of the transistors includes a bottom gate, a top gate disposed above the bottom gate, a middle gate disposed between the bottom gate and the top gate, a first channel layer disposed between the bottom gate and the middle gate, a first source electrode and a first drain electrode disposed at opposite sides of the first channel layer, a second channel layer disposed between the middle gate and the top gate, a second source electrode and a second drain electrode disposed at opposite sides of the second channel layer. The bottom gate, the middle gate and the top gate are electrically connected to one of the word lines. The first source electrode and the second source electrode are electrically connected to one of the source lines. Further, a first terminal of the memory cell is electrically connected to the first drain electrode and the second drain electrode, and a second terminal of the memory cell is electrically connected to one of the bit lines. In some embodiments, the first channel layer, the first source electrode and the first drain electrode are located at a first level height while the second channel layer, the second source and the second drain electrode are located at a second level height higher than the first level height. In some embodiments, the bottom gate is located at a level height lower than the first level height, the middle gate is located at a level height higher than the first level height and lower than the second level height, and the top gate is located at a level height higher than the second level height. In some embodiments, each of the transistors further includes a first gate insulating layer disposed between the bottom gate and the first channel layer, and the bottom gate is spaced apart from the first source electrode and the first drain electrode by the first gate insulating layer. In some embodiments, the at least one of the transistors further includes a second gate insulating layer disposed between the middle gate and the first channel layer, and the middle gate is spaced apart from the first source electrode and the first drain electrode by the second gate insulating layer. In some embodiments, the at least one of the transistors further includes a third gate insulating layer disposed between the middle gate and the second channel layer, and the middle gate is spaced apart from the second source electrode and the second drain electrode by the third gate insulating layer. In some embodiments, the at least one of the transistors further includes a fourth gate insulating layer disposed between the top gate and the second channel layer, and the top gate is spaced apart from the second source electrode and the second drain electrode by the fourth gate insulating layer. In some embodiments, the first source and the second source are electrically connected to one of the source lines through a first via, and the first drain electrode and the second drain electrode are electrically connected to the memory cell through a second via.

Still another embodiment of the present invention relates to a method including following steps is provided. A first gate is formed. A first gate insulating layer is formed over the first gate. A first channel layer, a first source electrode and a first drain electrode are formed over the first gate insulating layer. A second gate insulating layer is formed over the first channel layer, the first source electrode and the first drain electrode. A second gate is formed over the second gate insulating layer. A third gate insulating layer is formed over the second gate. A second channel layer, a second source and a second source are formed over the third gate insulating layer. A fourth gate insulating layer is formed over the second channel layer, the second source and the second source. A third gate is formed over the fourth gate insulating layer, wherein the first gate, the second gate and the third gate are electrically connected to one another, the first source electrode and the second source electrode are electrically connected to each other, and the first drain electrode and the second drain electrode are electrically connected to each other. In some embodiments, the first gate is formed to embedded in a first dielectric layer covered by the first gate insulating layer, the second gate is formed to embedded in a second dielectric layer covered by the third gate insulating layer, and the third gate is formed to embedded in a third dielectric layer covering the fourth gate insulating layer. In some embodiments, the method further includes: forming a first via and a second via, wherein the first source electrode is electrically connected to the second source electrode through the first via, and the first drain electrode is electrically connected to the second drain electrode through the second via. In some embodiments, the method further includes forming a memory cell over electrically connected to the first drain electrode and the second drain electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:

a transistor, comprising:

a stack of alternating gates and channel layers;

a source electrode and a drain electrode disposed at opposing sidewalls of each of the channel layers, a first source electrode is electrically connected to a second source electrode through a first via, and a first drain electrode is electrically connected to a second drain electrode through a second via, and wherein the first via is positioned on a top surface of the first source electrode, and the second via is positioned on a top surface of the first drain electrode, wherein the stack of alternating gates and channel layer comprises:

a first gate;

a second gate disposed above the first gate;

a first channel layer disposed between the first gate and the second gate; and a first gate insulating layer disposed between the first gate and the first channel layer, wherein the first gate insulating layer extends between a top surface of the first gate facing the first channel layer and bottom surfaces of the first source electrode, the first channel layer and the first drain electrode.

2. The memory device according to claim 1, further comprising:

a third gate disposed above the second gate;

a second channel layer disposed between the second gate and the third gate, wherein the top surface of the first source electrode substantially levels with the top surface of the first drain electrode and a top surface of the first channel layer, and a top surface of the second source electrode substantially levels with top surfaces of the second drain electrode and the second channel layer.

3. The memory device according to claim 2, wherein the first channel layer, the first source electrode and the first drain electrode are located at a first level height while the second channel layer, the second source electrode and the second drain electrode are located at a second level height higher than the first level height, and the first gate is located at a level height lower than the first level height, the second gate is located at a level height higher than the first level height and lower than the second level height, and the third gate is located at a level height higher than the second level height.

4. The memory device according to claim 1, wherein the first gate is spaced apart from the first source electrode and the first drain electrode by the first gate insulating layer.

5. The memory device according to claim 1, wherein the transistor further comprises a second gate insulating layer disposed between the second gate and the first channel layer, and the second gate is spaced apart from the first source electrode and the first drain electrode by the second gate insulating layer.

6. The memory device according to claim 2, wherein the transistor further comprises a third gate insulating layer disposed between the second gate and the second channel layer, and the second gate is spaced apart from the second source electrode and the second drain electrode by the third gate insulating layer.

7. The memory device according to claim 2, wherein the transistor further comprises a fourth gate insulating layer disposed between the third gate and the second channel layer, and the third gate is spaced apart from the second source electrode and the second drain electrode by the fourth gate insulating layer.

8. The memory device according to claim 7, wherein the first via and the second via further penetrates through the second gate insulating layer, the third gate insulating layer, and the fourth gate insulating layer.

9. A semiconductor die, comprising:

a semiconductor substrate;

an interconnect structure disposed over the semiconductor substrate, the interconnect structure comprising an embedded memory cell array, the embedded memory cell array comprising source lines, and memory devices, at least one of the memory devices comprising a transistor and a memory cell electrically connected to the transistor, and of the transistor comprising:

a bottom gate;

a top gate disposed above the bottom gate;

a middle gate disposed between the bottom gate and the top gate;

a first channel layer disposed between the bottom gate and the middle gate;

a first source electrode and a first drain electrode disposed at opposite sidewalls of the first channel layer;

a second channel layer disposed between the middle gate and the top gate; and a second source electrode and a second drain electrode disposed at opposite sidewalls of the second channel layer, wherein the first source electrode and the second source electrode are electrically connected to one of the source lines through a first via, and the first drain electrode and the second drain electrode are electrically connected to the memory cell through a second via, and the first via vertically extends through the second source electrode and abuts the first source electrode, the second via vertically extends through the second drain electrode and abuts the first drain electrode, a first gate insulating layer is disposed between the bottom gate and the first channel layer, and the first gate insulating layer is in contact with sidewalls of the first via and the second via.

10. The semiconductor die according to claim 9, wherein a top surface of the first source electrode substantially levels with top surfaces of the first drain electrode and the first channel layer, and a top surface of the second source electrode substantially levels with top surfaces of the second drain electrode and the second channel layer.

11. The semiconductor die according to claim 10, wherein the first channel layer, the first source electrode and the first drain electrode are located at a first level height while the second channel layer, the second source electrode and the second drain electrode are located at a second level height higher than the first level height, and the bottom gate is located at a level height lower than the first level height, the middle gate is located at a level height higher than the first level height and lower than the second level height, and the top gate is located at a level height higher than the second level height.

12. The semiconductor die according to claim 9, wherein the bottom gate is spaced apart from the first source electrode and the first drain electrode by the first gate insulating layer.

13. The semiconductor die according to claim 9, wherein the transistor further comprises a second gate insulating layer disposed between the middle gate and the first channel layer, and the middle gate is spaced apart from the first source electrode and the first drain electrode by the second gate insulating layer.

14. The semiconductor die according to claim 13, wherein the transistor further comprises a third gate insulating layer disposed between the middle gate and the second channel layer, and the middle gate is spaced apart from the second source electrode and the second drain electrode by the third gate insulating layer.

15. The semiconductor die according to claim 14, wherein the transistor further comprises a fourth gate insulating layer disposed between the top gate and the second channel layer, and the top gate is spaced apart from the second source electrode and the second drain electrode by the fourth gate insulating layer.

16. The semiconductor die according to claim 15, wherein the first via and the second via further penetrates through the second gate insulating layer, the third gate insulating layer, and the fourth gate insulating layer.

17. A method, comprising:

forming a stack of alternating gates and channel layers, comprising:

forming a first gate;

forming a first gate insulating layer over the first gate;

forming a first channel layer over the first gate insulating layer;

forming a second gate insulating layer over the first channel layer; and forming a second gate over the second gate insulating layer;

forming a source electrode and a drain electrode at opposing sidewalls of each of the channel layers;

forming a first via and a second via, a first source electrode is electrically connected to a second source electrode through the first via, and a first drain electrode is electrically connected to a second drain electrode through the second via, wherein the first via is positioned on a top surface of the first source electrode, the second via is positioned on a top surface of the first drain electrode, the first via penetrates through the second gate insulating layer and the second source electrode, and the second via penetrates through the second gate insulating layer and the second drain electrode.

18. The method according to claim 17, further comprising:

forming a third gate insulating layer over the second gate;

forming a second channel layer, the second source electrode and the second drain electrode over the third gate insulating layer, wherein a top surface of the second source electrode substantially levels with top surfaces of the second drain electrode and the second channel layer;

forming a fourth gate insulating layer over the second channel layer, the second source electrode and the second drain electrode; and forming a third gate over the fourth gate insulating layer and wherein the first gate is embedded in a first dielectric layer covered by the first gate insulating layer, the second gate is embedded in a second dielectric layer covered by the third gate insulating layer, and the third gate is embedded in a third dielectric layer covering the fourth gate insulating layer.

19. The method according to claim 18, wherein the first via and the second via further penetrates through the third gate insulating layer, and the fourth gate insulating layer.

20. The method according to claim 17 further comprising:

forming a memory cell over and electrically connected to the first drain electrode the second drain electrode.

* * * * *